US012811368B2

(12) United States Patent
Uchida et al.

(10) Patent No.: US 12,811,368 B2
(45) Date of Patent: Nov. 24, 2026

(54) LIGHT SOURCE DEVICE, AND RANGING DEVICE

(71) Applicant: CANON KABUSHIKI KAISHA, Tokyo (JP)

(72) Inventors: Takeshi Uchida, Kanagawa (JP); Takako Suga, Kanagawa (JP); Tatsuro Uchida, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1009 days.

(21) Appl. No.: 18/068,954

(22) Filed: Dec. 20, 2022

(65) Prior Publication Data

US 2023/0216277 A1 Jul. 6, 2023

(30) Foreign Application Priority Data

Jan. 1, 2022 (JP) ................................ 2022-000024

(51) Int. Cl.
*H01S 5/183* (2006.01)
*G01S 7/481* (2006.01)
(Continued)

(52) U.S. Cl.
CPC ........ *H01S 5/18361* (2013.01); *G01S 7/4814* (2013.01); *G01S 7/4815* (2013.01); *G01S 17/08* (2013.01); *H01S 5/0421* (2013.01); *H01S 5/04254* (2019.08); *H01S 5/04256* (2019.08); *H01S 5/18313* (2013.01); *H01S 5/3095* (2013.01); *H01S 5/3416* (2013.01);
(Continued)

(58) Field of Classification Search
CPC ............. H01S 5/04256; H01S 5/04257; H01S 5/18302; H01S 5/18305; H01S 5/18386; H01S 5/18394; H01S 5/423
See application file for complete search history.

(56) References Cited

U.S. PATENT DOCUMENTS 5,136,603 A * 8/1992 Hasnain ................ H01S 5/0264
372/50.21
9,269,853 B2 2/2016 Suga
(Continued)

FOREIGN PATENT DOCUMENTS

JP 2001-24277 A 1/2001
JP 2006-121010 A 5/2006
(Continued)

*Primary Examiner* — Michael Carter
(74) *Attorney, Agent, or Firm* — VENABLE LLP

(57) ABSTRACT

A light source device in which a plurality of semiconductor light-emitting elements are disposed, each of the plurality of semiconductor light-emitting elements being configured with a first reflector, a resonator cavity including an active layer, and a second reflector which are stacked in this sequence on a semiconductor substrate, wherein in each of the semiconductor light-emitting elements, an electric contact region for supplying carriers to the active layer is disposed on a surface of the second reflector on an opposite side thereof to the active layer, and wherein the plurality of semiconductor light-emitting elements include a first semiconductor light-emitting element of which shape of the contact region is a first shape, and a second semiconductor light-emitting element of which shape of the contact region is a second shape which is different from the first shape.

14 Claims, 22 Drawing Sheets

(51) Int. Cl.

| | |
|---|---|
| ***G01S 17/08*** | (2006.01) |
| ***H01S 5/042*** | (2006.01) |
| ***H01S 5/30*** | (2006.01) |
| ***H01S 5/34*** | (2006.01) |
| ***H01S 5/343*** | (2006.01) |
| ***H01S 5/42*** | (2006.01) |

(52) U.S. Cl.
CPC ...... *H01S 5/34313* (2013.01); *H01S 5/34353* (2013.01); *H01S 5/423* (2013.01); *H01S 5/18394* (2013.01)

(56) References Cited

U.S. PATENT DOCUMENTS

| | | | | |
|---|---|---|---|---|
| 9,316,531 | B2 | 4/2016 | Suga | |
| 9,595,809 | B2 | 3/2017 | Uchida | |
| 10,403,784 | B2 | 9/2019 | Suga | |
| 2001/0006528 | A1* | 7/2001 | Sato | H01S 5/423 438/22 |
| 2008/0043793 | A1 | 2/2008 | Ueki | |
| 2008/0240196 | A1 | 10/2008 | Nishida | |
| 2021/0296862 | A1* | 9/2021 | Kondo | H01S 5/426 |
| 2022/0069546 | A1* | 3/2022 | Roucka | H01S 5/18388 |
| 2023/0059270 | A1 | 2/2023 | Suga | |
| 2023/0216275 | A1 | 7/2023 | Suga | |
| 2023/0216276 | A1 | 7/2023 | Suga | |

FOREIGN PATENT DOCUMENTS

| | | | | |
|---|---|---|---|---|
| JP | 2006278572 | A | * | 10/2006 |
| JP | 2008-47717 | A | | 2/2008 |
| JP | 2008-277780 | A | | 11/2008 |
| JP | 2008277615 | A | * | 11/2008 |

* cited by examiner

LIGHT SOURCE DEVICE, AND RANGING DEVICE

BACKGROUND OF THE INVENTION

Field of the Invention

The present invention relates to a light source device, and a ranging device.

Description of the Related Art

Japanese Patent Application Publication No. 2006-278572 discloses an example of mounting two types of vertical cavity surface emitting lasers (VCSELs) which emit beams of different far-field patterns (FFPs) on a same substrate. Here in order to differentiate the FFPs, a transverse mode in oscillation is controlled by disposing a metal member on an optical path, where the beam is emitted from one of the VCSELs, so as to provide a loss to a higher order mode.

Another method of providing a loss to a higher order mode is a method of controlling a reflectance in a plane of a reflector by processing an outermost surface of an upper reflector of the VCSEL, or performing patterning of a dielectric layer thereon, so as to selectively provide a loss to the higher order mode.

By disposing the VCSELs, which emit beams of different FFPs, on the same substrate and superimposing these light beams emitted therefrom, as described in Japanese Patent Application Publication No. 2006-278572 the FFPs emitted from the VCSEL array may be uniformed. In other words, a uniform light emission becomes possible.

Uniform light emission is useful when a VCSEL is used as a light source for illumination. For example, a VCSEL is used as a light source for a time-of-flight (ToF) type light detection and ranging (LiDAR). Since in a case of emitting light to a measurement target area, uniform light emission can prevent the generation of a portion in which light quantity is insufficient, and prevent missing the detection of a small object in such a portion, for example.

In some cases of using the VCSEL for illumination, e.g. using the VCSEL as a light source for ToF, there may be demand for 0.1 W or more peak output of the optical output, or sometimes even to the 100 W level, depending on the application, even if the pulse width is short. In such a case, the required quantity of light is implemented by emitting light using a two-dimensional array in which many VCSELs are arranged.

In the case of using an array of many VCSELs, a light-emitting diameter of each VCSEL may be designed to be large, so that a ratio of an area that is used as an actual light-emitting region can be increased relative to the chip area of the VCSEL array. In other words, by increasing the light-emitting diameter of each VCSEL, the chip area that is needed in the VCSEL array can be decreased, which is advantageous in terms of connection with the optical system and in terms of cost.

If the light-emitting diameters of VCSELs are large (typically the case of the light-emitting diameter of 10 μm or more), however, it becomes impossible to control the transverse mode by selectively providing a loss to the higher order mode. Therefore in the case of using the method disclosed in Japanese Patent Application Publication No. 2006-278572, the light-emitting diameters needs to be controlled to 10 μm or less in order to control the FFP, and it is difficult to implement both reducing the chip area by increasing the light-emitting diameters, and controlling (uniforming) the FFP.

SUMMARY OF THE INVENTION

It is an object of the present invention to provide a light source device that can implement both uniforming the FFP and reducing the chip area by increasing the light-emitting diameters.

One aspect of the present invention is a light source device in which a plurality of semiconductor light-emitting elements are disposed, each of the plurality of semiconductor light-emitting elements being configured with a first reflector, a resonator cavity including an active layer, and a second reflector which are stacked in this sequence on a semiconductor substrate, wherein in each of the semiconductor light-emitting elements, an electric contact region for supplying carriers to the active layer is disposed on a surface of the second reflector on an opposite side thereof to the active layer, and wherein the plurality of semiconductor light-emitting elements include a first semiconductor light-emitting element of which shape of the contact region is a first shape, and a second semiconductor light-emitting element of which shape of the contact region is a second shape which is different from the first shape.

According to the present invention, both uniforming the FFP and reducing the chip area by increasing the light-emitting diameters can be implemented.

Further features of the present invention will become apparent from the following description of exemplary embodiments with reference to the attached drawings.

DESCRIPTION OF THE EMBODIMENTS

Example 1

A VCSEL array (light source device) 10 of Example 1 of the present invention is configured with a plurality of VCSELs (semiconductor light-emitting elements) that are disposed thereon.

Figure 1A:
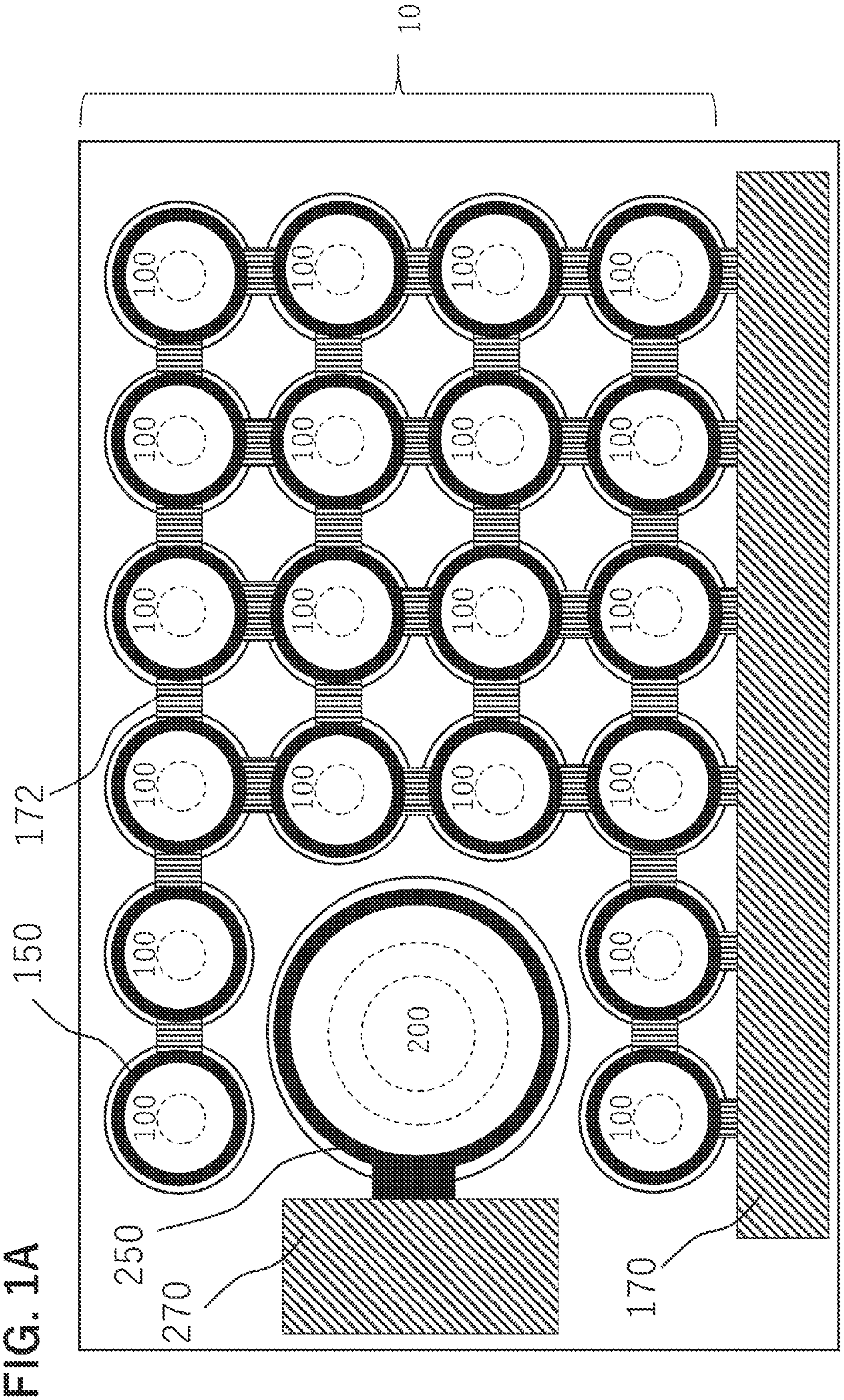
FIG. 1A is a top view of a VCSEL array 10 of Example 1.

FIG. 1A is a diagram for describing the VCSEL disposition in the VCSEL array 10. The VCSEL array 10 in Example 1 is configured with two types of VCSELs (VCSEL 100 and VCSEL 200). The VCSEL 100 emits a laser beam to be a uni-modal FFP, and the VCSEL 200 emits a laser beam to be a bi-modal FFP (see FIG. 2C).

As mentioned later, the VCSEL 100 and the VCSEL 200 have different shapes of electric contact regions (indicated by the dotted lines in FIG. 1A), which are formed on the front face side of the upper DBR, and thereby have different FFP profiles. Details thereof will be described later.

The VCSEL array 10 of Example 1 is configured with 20 VCSELs 100 and one VCSEL 200. The number of VCSELs 100 is more than the number of VCSELs 200 because the VCSEL 100 has a small light-emitting area and the optical output from each VCSEL is small. The ratio of a number of VCSELs 100 and a number of VCSELs 200 is determined such that the intensity becomes uniform when the emitted beams thereof are superimposed in the far field region.

A configuration of each VCSEL will be described.

Figure 1B:
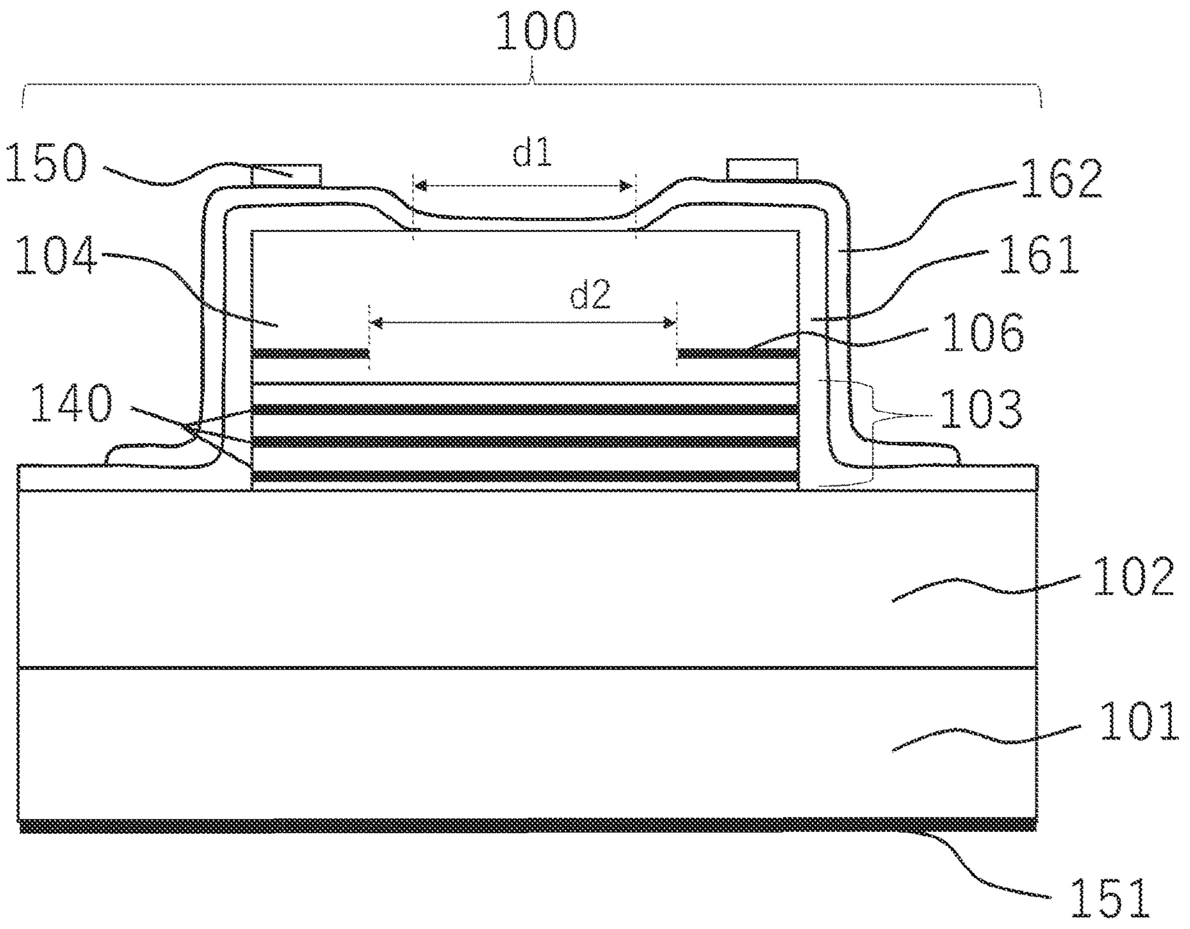
FIG. 1B is a cross-sectional view of a VCSEL 100 of Example 1.

FIG. 1B is a schematic cross-sectional view of the VCSEL 100. The VCSEL 100 is configured with a lower DBR (first reflector) 102, a semiconductor resonator cavity 103, and an upper DBR (second reflector) 104 which are stacked in this sequence on a GaAs substrate (semiconductor substrate) 101. In FIGS. 3A to 3G, these members are directly in contact with each other, but another member may be disposed there between. The above description is for describing the structure, and is not intended to limit the sequence of manufacturing each member.

Three quantum well layers 140 are disposed in the resonator cavity 103. An $Al_{0.98}GaAs$ is oxidized in a part of the upper DBR 104 by steam oxidation, whereby an oxidation constriction layer 106, which has insulation properties, is formed. In Example 1, the current constriction portion is formed on the upper DBR 104 by the oxidation constriction layer 106, but the current constriction portion may be formed on the lower DBR 102 or in the resonator cavity 103.

The resonator cavity 103 and the upper DBR 104 are provided to be tubular mesa-shaped, and are covered with an insulation film 161. Furthermore, an indium tin oxide (ITO) layer is formed on the insulation film 161.

As illustrated in FIG. 1B, the insulation film 161, of which center portion has been partially removed, is formed on the upper face of the upper DBR 104 which has been processed to be mesa-shaped, and in this removed portion, the ITO layer 162 is in contact with the upper face of the upper DBR 104. The portion where the insulation film 161 has been removed is hereafter called the “insulation opening”. This means that the ITO layer 162 is in contact with the upper face of the upper DBR 104 in the insulation opening portion. The shape of the insulation opening of the insulation film 161 is a circle in Example 1. A ring electrode 150 is electrically in contact with a part of the ITO layer 162. A common electrode 151 is in ohmic contact with the rear face of the GaAs substrate 101.

Carriers supplied from a ring electrode 150 are supplied to the resonator cavity 103 via the insulation opening portion. In other words, a contact region of the upper DBR 104 surface (surface on the opposite side of the surface that is in contact with an active layer) is formed by: the insulation film 161 of which a part has been removed in a circular shape; and the ITO layer 162, which is in contact with the upper DBR 104 in the insulation opening portion in which the insulation film 161 has been removed. The shape of the contact region (first shape) in the VCSEL 100 is a circle.

When an $Al_{0.1}GaAs$ layer and an $Al_{0.9}GaAs$ layer, of which optical thicknesses are both $\lambda c/4$, form a pair, the lower distributed Bragg reflector (DBR) 102 is configured with 35 pairs that are stacked. $\lambda c$ is a center wavelength of a high reflection band of the lower DBR 102, and is 940 nm in Example 1.

The quantum well layer 140 has a configuration where an 8 nm thick $In_{0.1}GaAs$ layer is sandwiched by 10 nm thick $Al_{0.1}GaAs$ barrier layers. In Example 1, three quantum well layers are disposed in the resonator cavity 103.

When the $Al_{0.1}GaAs$ layer and an $Al_{0.9}GaAs$ layer, both of which optical film thicknesses are both $\lambda c/4$, form a pair, the upper DBR 104 is configured with 20 pairs that are stacked. A part of the $Al_{0.1}GaAs$ layer on the top layer, however, is replaced with a GaAs contact layer of which thickness is 50 nm, and carrier density is $1\times10^{19}$ $cm^{-3}$, so as to improve the electric contact properties with the transparent conductive layer (ITO layer) 162. Furthermore, a part of the $Al_{0.1}GaAs$ layer closest to the quantum well layer 140 of the upper DBR is replaced with an $Al_{0.98}GaAs$ layer of which thickness is 30 nm. After a mesa of the VCSEL 100 is formed, the $Al_{0.98}GaAs$ layer is oxidized from the side wall of the mesa for a predetermined length from the edge of the mesa by steam oxidation, whereby the oxidation constriction layer 106 having insulation properties is formed.

A diameter d1 of the insulation opening portion in which the insulation film 161 has been removed is 10 and a diameter d2 of the semiconductor portion (that is, a portion where conductivity is high and current can flow, that is, the non-oxidized portion) on the inner side of the oxidation constriction layer 106 is 30 μm. In the planar view, the center of the insulation opening portion and the center of the non-oxidized portion approximately match, and the insulation opening portion is included in the non-oxidized portion. Since the non-oxidized portion is a portion of the resonator cavity 103 through which current can flow, the diameter of the non-oxidized portion becomes the light-emitting diameter of the VCSEL. This aspect of Example 1 is the same as Example 2 and in later examples.

A number of pairs is designed such that the reflectance of the lower DBR 102 is higher than that of the upper DBR 104. Further, the insulation film 161 and the ITO layer 162 disposed on the upper DBR 104 are also transparent and transmits light at the light-emitting wavelength, hence the VCSEL 100 of Example 1 can extract light from the side of the upper DBR 104.

Figure 1C:
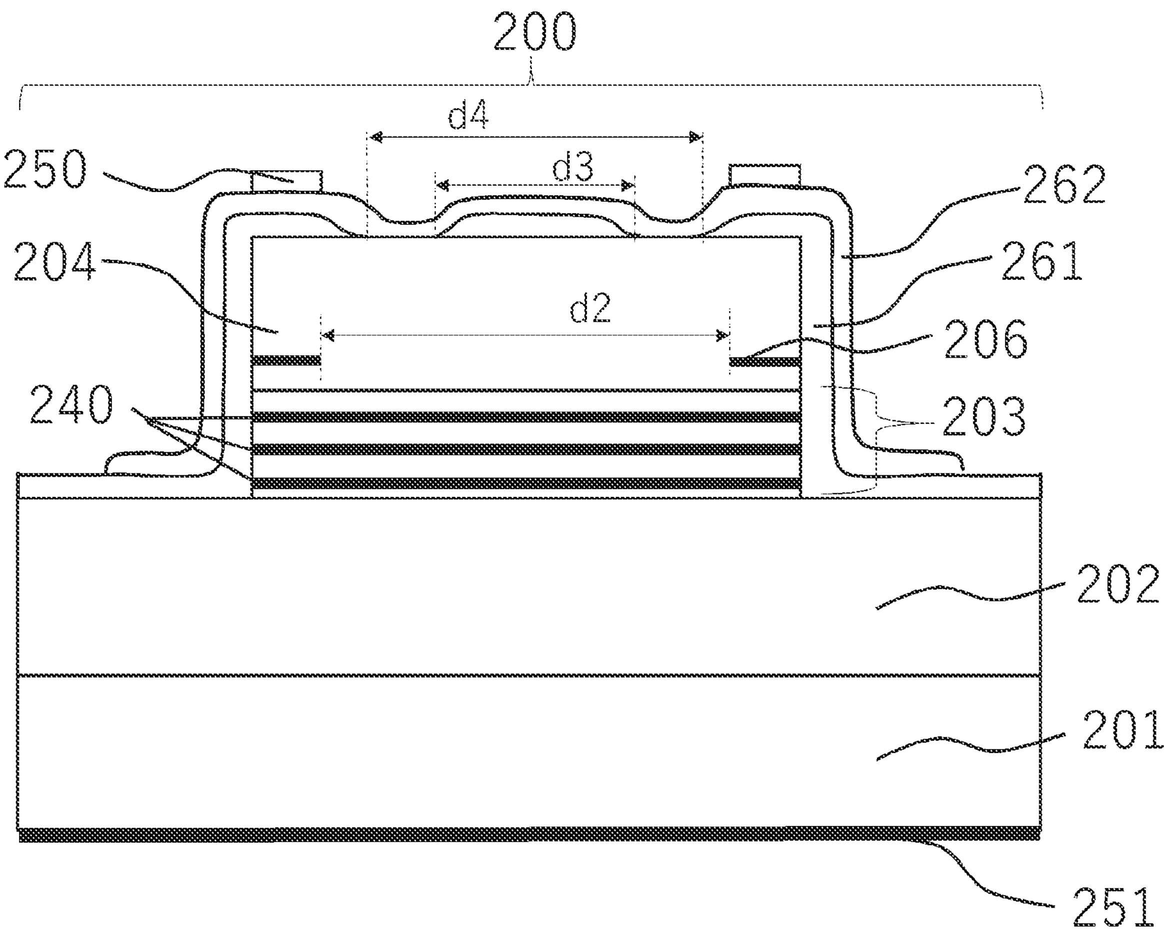
FIG. 1C is a cross-sectional view of a VCSEL 200 of Example 1.

FIG. 1C is a schematic cross-sectional view of the VCSEL 200. The VCSEL 200 is configured with a lower DBR (first reflector) 202, a semiconductor resonator cavity 203, and an upper DBR (second reflector) 204, which are stacked in this sequence on a GaAs substrate (semiconductor substrate) 201.

Three quantum well layers 240 are disposed in the resonator cavity 203. An $Al_{0.98}GaAs$ is oxidized in a part of the upper DBR by steam oxidation, whereby an oxidation constriction layer 206, which has insulation properties, is formed.

The resonator cavity 203 and the upper DBR 204 are processed to be tubular mesa-shaped, and are covered with an insulation film 261. Furthermore, an indium tin oxide (ITO) layer is formed on the insulation film 261.

As illustrated in FIG. 1C, the insulation film 261, of which center portion has been removed in an annular shape, is formed on the upper face of the upper DBR 204 which has been processed to be mesa-shaped, and in this removed portion (insulation opening), the ITO layer 262 is in contact with the upper face of the upper DBR 204. The shape of the insulation opening of the VCSEL 200 is an annular shape (ring shape). A ring electrode 250 is in contact with a part of the ITO layer 262. A common electrode 251 is in ohmic contact with the rear face of the GaAs substrate 201.

Carriers supplied from a ring electrode 250 are supplied to the resonator cavity 203 via the insulation opening portion. In other words, a contact region of the upper DBR 204 surface (surface on the opposite side of the surface that is in contact with an active layer) is formed by: the insulation film 261 of which a part has been removed in an annular shape; and the ITO layer 262, which is in contact with the upper DBR 204 in the insulation opening portion in which the insulation film 261 has been removed. The shape (second shape) of the contact region in the VCSEL 200 is an annular shape.

An inner diameter d3 of the annular-shaped insulation opening portion, in which the insulation film 261 has been removed is 35 μm, and an outer diameter d4 thereof is 45 μm. The diameter d2 of the semiconductor portion (that is, a portion where conductivity is high and current can flow, that is, the non-oxidized portion) on the inner side of the oxidation constriction layer 206 is 70 μm. In the planar view, the center of the insulation opening portion and the center of the non-oxidized portion approximately match, and the insulation opening portion is included in the non-oxidized portion.

The layer configuration of the VCSEL in FIG. 1C is monolithically formed on the same substrate as the VCSEL in FIG. 1B using the same crystal growth layers, at the same time with the VCSEL in FIG. 1B. Hence a detailed description of the layer configuration of FIG. 1C will be omitted.

The disposition of the VCSELs 100 and 200 in the VCSEL array 10 will be further described with reference to FIG. 1A.

The ring electrodes 150 on the VCSELs 100 are electrically connected to each other via each wiring electrode 172. The ring electrodes 150 are also electrically connected with a pad 170 for wire bonding to supply current from the outside. The ring electrode 250 on the VCSEL 200 is electrically connected to a pad 270 for wire bonding, which is used for supplying current from the outside.

The reason the VCSEL 200 is disposed on an edge of the array, as illustrated in FIG. 1A, instead of being completely surrounded by the VCSELs 100, is because the wiring electrode from the VCSEL 200 can be connected to the pad 270, without crossing with other wiring electrodes. This is advantageous in terms of the manufacturing process, and preventing electrical cross-talk via parasitic capacitance, since there is no need to use multilayer wiring.

In d-ToF applications, it is best to change current in nanoseconds or less. The current value also become larger (1A or more) compared with the current values used in other common applications (e.g. communication). Therefore if wirings are connected by parasitic capacitance, unintended current tends to flow more easily via this parasitic capacitance, and controllability of the FFP, based on controlling the current value, drops in some cases due to the unintended current that may flow.

In FIG. 1A, the VCSELs 100 are disposed in a square array, but may be disposed differently, such as in a triangular array. To implement the above effects, a position, a number and a shape of pads for wire bonding and those of the wiring electrodes 172 connecting the ring electrodes 150 of the VCSELs on each mesa may be configured differently if the electric connections are equivalent to the above configuration in FIGS. 1A to 1C.

Figure 2A:
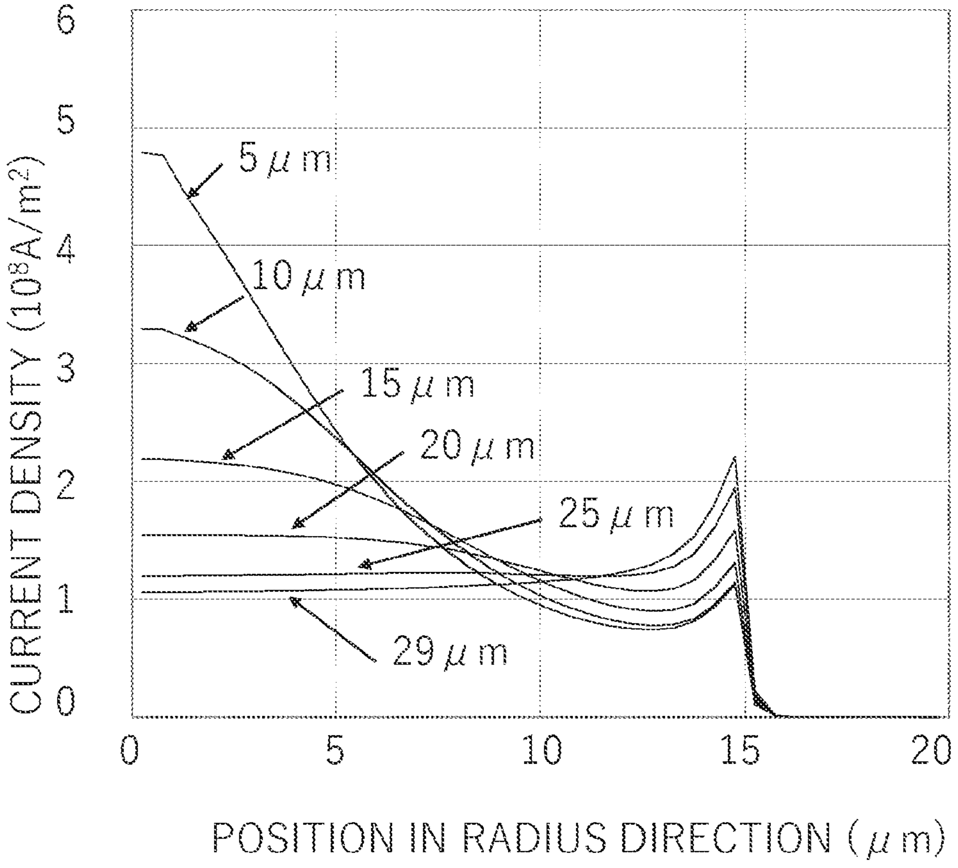
FIG. 2A is a graph for describing a current density distribution in Example 1.

FIG. 2A is a graph of a result of calculating the current density distribution of current injected into the active layer in the configuration of the VCSEL 100.

FIG. 2A indicates the distribution of the current density of the current that flows into the quantum well layer 140 at the oxidation constriction diameter d2 of 30 μm when the diameter d1 of the active layer insulation opening portion changes from 5 μm to 25 μm. The abscissa of FIG. 2A indicates a position in the radius direction where the center of the mesa (that is, the center of the non-oxidized portion) is position 0. Hence, it is ascertained that the current density distribution, of which center portion protrudes, can be formed in a range where the diameter d1 of the insulation opening portion is 20 μm or less. Thus when $d1<d2$, the profile of the current density distribution of the current that flows into the current quantum well layer can protrude in the center portion, and the far field pattern can be controlled. d1 is 20 μm in Example 1.

Figure 2B:
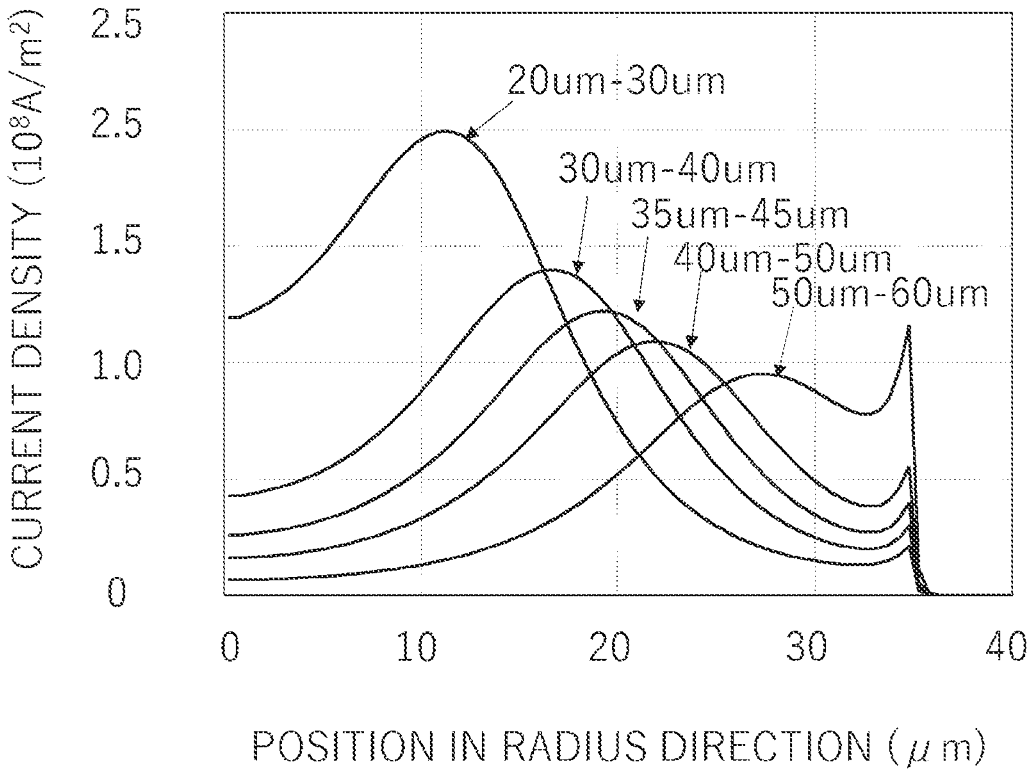
FIG. 2B is a graph for describing a current density distribution in Example 1.

FIG. 2B is a graph of a result of calculating the current density distribution of current injected into the active layer in the configuration of the VCSEL 200. In Example 1, the inner diameter of the annular-shaped insulation opening portion in which the insulation layer has been removed is 35 μm, and the outer diameter thereof is 45 μm. For comparison, the calculation results when the width of the insulation opening is 10 μm and the inner diameter is changed from 20 μm to 50 μm, are also indicated. The diameter d2 of the non-oxidized portion of the oxidation constriction layer is 70 μm.

As indicated in FIG. 2B, in the case where the inner diameter is 35 μm and the outer diameter is 45 μm, the current density distribution of the current injected into the active layer peaks at the position of 20 μm, and the minimum value of the current density at the position 0 and the position around 33 μm is similar to those of other conditions. By creating the annular-shaped current injection distribution like this, the bi-modal current density distribution can be implemented.

Figure 2C:
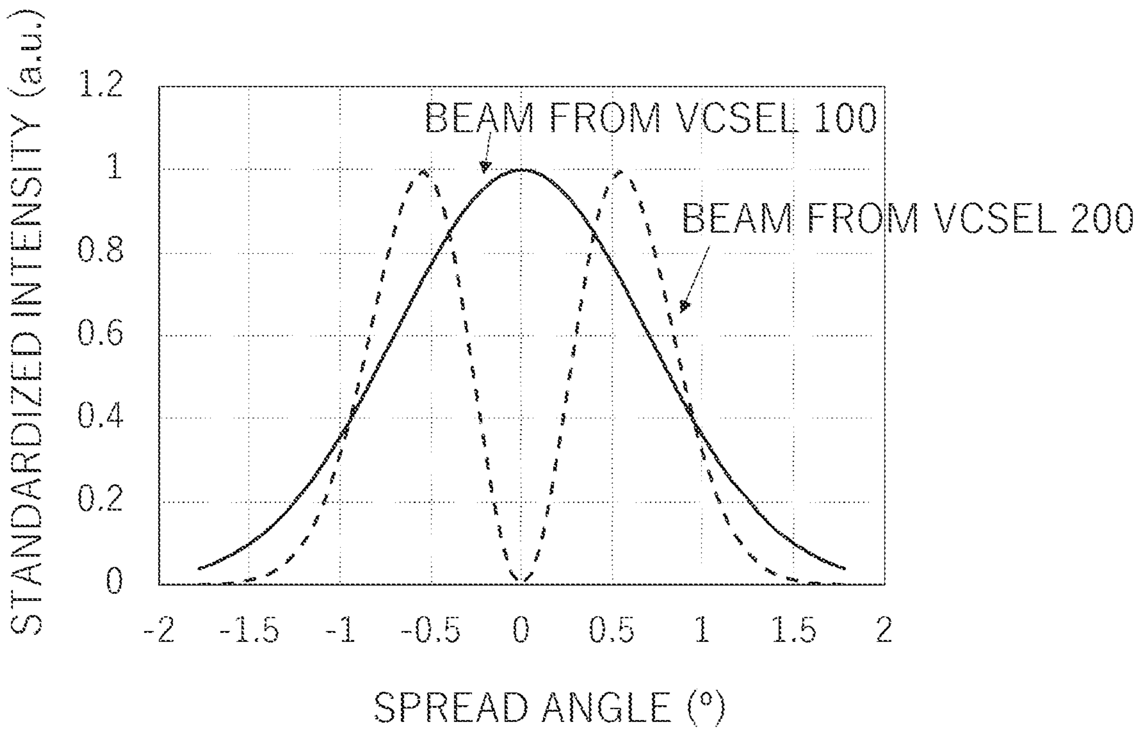
FIG. 2C is a graph for describing a beam intensity distribution in a far field region in Example 1.
Figure 2D:
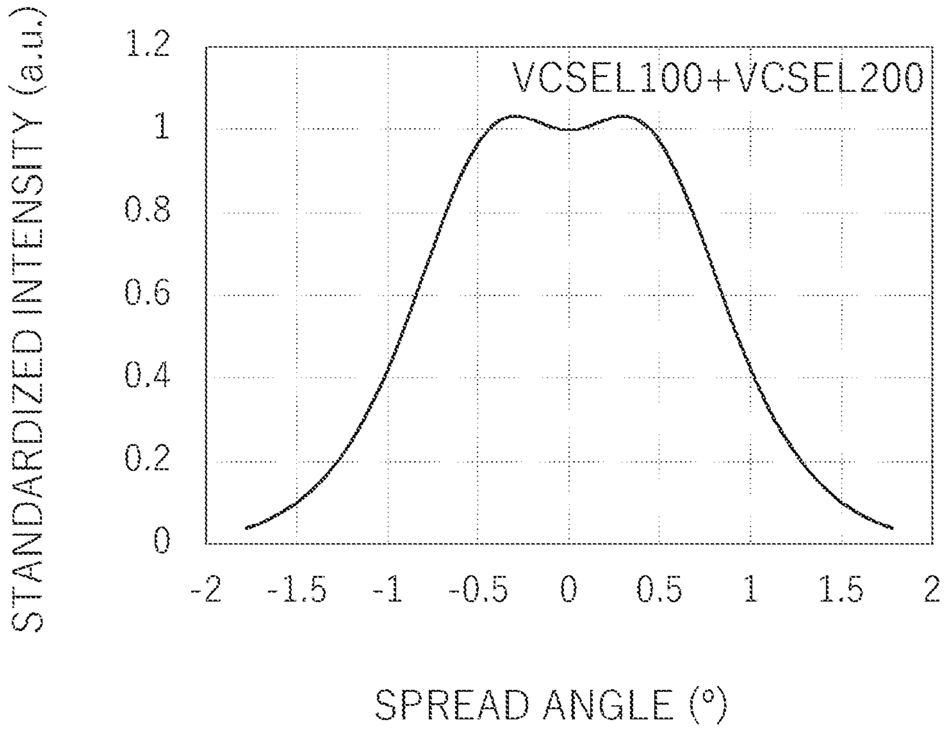
FIG. 2D is a graph for describing a beam intensity distribution in a far field region in Example 1.

FIG. 2C indicates intensity distributions of the beams emitted from the VCSEL 100 and the VCSEL 200 in the far field region. This is the result of roughly estimating the intensity distributions in the 0-order and first-order transverse modes based on the half value width of the current density distributions indicated in FIGS. 2A and 2B, and determining the far field patterns therefrom. FIG. 2D is an intensity distribution when the above intensity distributions are superimposed at the intensity ratio based on the number of VCSELs indicated in FIG. 1A.

As this gain indicates, by comparing the beams of the VCSEL 100 and the VCSEL 200 and superimposing the beams at the designed intensity ratio, the intensity becomes uniform within the range of the spread angle of −0.5 to +0.5° at the center.

The intensity ratio between the VCSEL 100 and the VCSEL 200 is designed to be about 20:1, and the components are those of the VCSEL 100. Further, each VCSEL 100 has a small light-emitting diameter and can emit only a small quantity of light. Therefore in the VCSEL array 10 of Example 1, more VCSELs 100 are disposed than the VCSELs 200. The VCSEL array 10 is designed such that when the beams from all the VCSELs constituting the VCSEL array 10 are superimposed, the intensity becomes uniform in the center portion of the spreading angle (range of ±0.5° in Example 1).

Comparison of the array size between the VCSEL array 10 of Example 1 and a conventional VCSEL array will be described next. As indicated in FIG. 1A, the VCSEL array 10 of Example 1 is configured with the VCSELs 100 having a light-emitting diameter of 30 μm and the VCSEL 200 having a light-emitting diameter of 70 μm. The pitch of the VCSELs 100 is 64 μm considering the light-emitting diameter, the size required around the light-emitting diameter, and the like. Six VCSELs 100 are disposed horizontally and four VCSELs 100 are disposed vertically, therefore the size of the VCSEL array 10 is 384 μm horizontally and 256 μm vertically.

In the case of the conventional configuration, on the other hand, the light-emitting diameter must be 10 μm or less in order to control the beam profile, as mentioned above. Therefore a case where the light-emitting diameter is 10 μm, and the VCSELs are disposed at a pitch smaller than Example 1 by 20 μm (the difference of sizes of the light-emitting diameters between a conventional configuration and Example 1), more specifically at a pitch of 40 μm, is considered. In order to acquire the same optical output as Example 1 at the same drive current density, the total light-emitting area of the VCSELs is designed to be the same as the VCSEL array 10 of Example 1. In calculation, in the case of the conventional configuration, a number of VCSELs required to achieve the optical output equivalent to Example 1 is about 225. If these VCSELs are arranged in a 15×15 array, the length is 660 μm vertically and horizontally.

As described above, in the VCSEL array 10 of Example 1, an optical output equivalent to the conventional VCSEL array can be implemented in a smaller area. This is because in Example 1, the VCSEL array is configured using a larger light-emitting diameter than the conventional array. The VCSEL array of Example 1 can be configured using a larger light-emitting diameter, because the FFP can be uniform even if the light-emitting diameter is larger than the conventional array. This aspect of Example 1 is the same for Example 2 and later examples.

Example 2

Figure 3A:
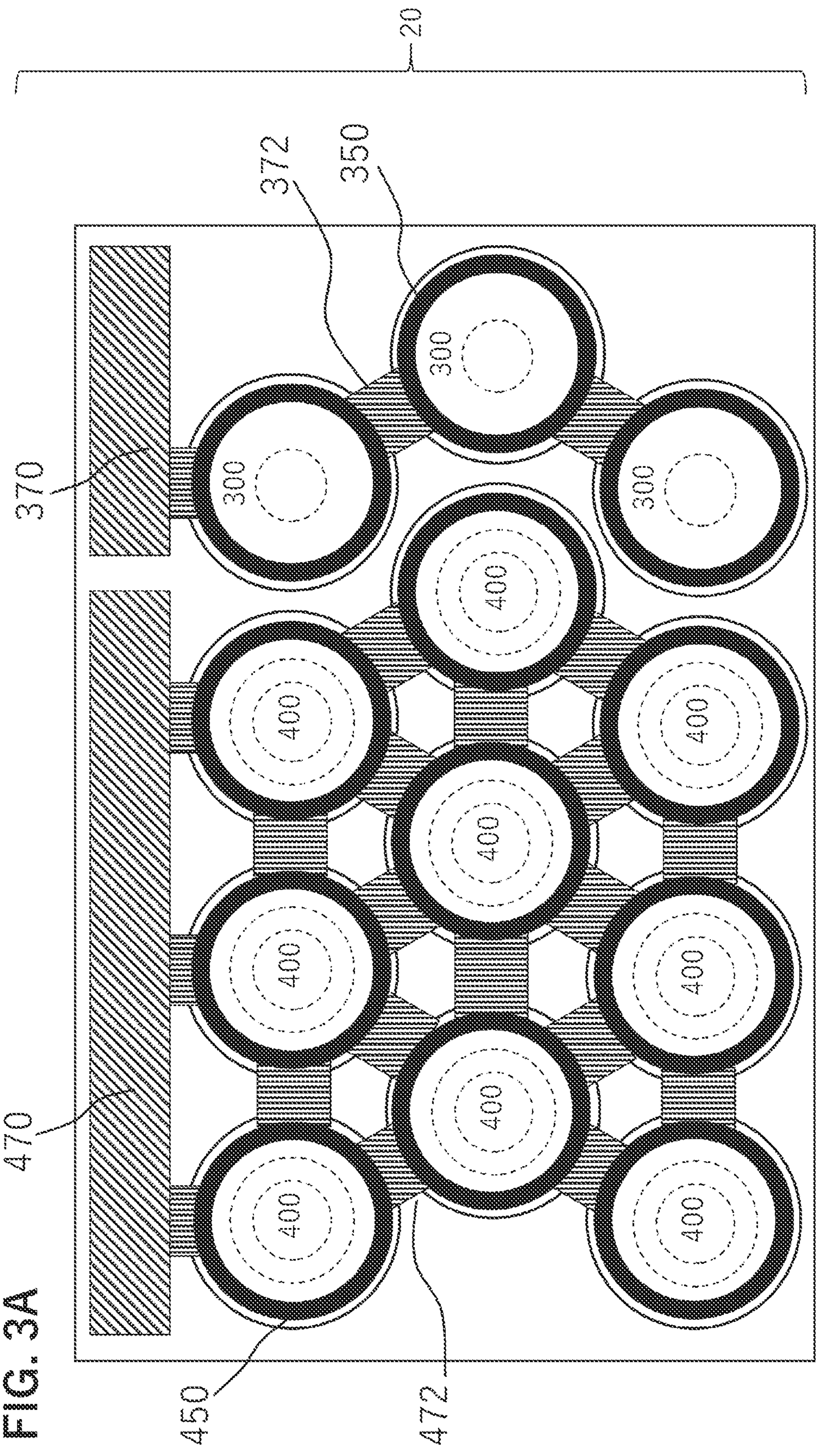
FIG. 3A is a top view of a VCSEL array 20 of Example 2.

FIG. 3A indicates a VCSEL array 20 according to Example 2 using VCSELs 300 and VCSELs 400. In Example 2, the VCSEL 300 that emits laser beams of a uni-modal FFP and the VCSEL 400 that emits laser beams of a bi-modal FFP have similar sizes, and the light-emitting diameters thereof are both about 70 μm. In other words, compared with Example 1, the light-emitting diameter of the VCSEL that emits laser beams of a uni-modal FFP is larger.

Ring electrodes 350 on the VCSELs 300 are electrically connected to each other via each wiring electrode 372, and are also electrically connected to a pad 370 for wire bonding to supply current from the outside. Ring electrodes 450 on the VCSELs 400 are electrically connected to each other via each wiring electrode 472, and are also electrically connected to a pad 470 for wire bonding to supply current from the outside.

The reason that VCSELs 300 are disposed on an edge of the array, as illustrated in FIG. 3A, instead of being completely surrounded by the VCSELs 400, is because the wiring electrode from the VCSELs 300 can be connected to the pad 370, without crossing with other wiring electrodes. This is advantageous in terms of the manufacturing process and preventing electrical cross-talk via parasitic capacitance, since there is no need to use multilayer wiring.

Figure 3B:
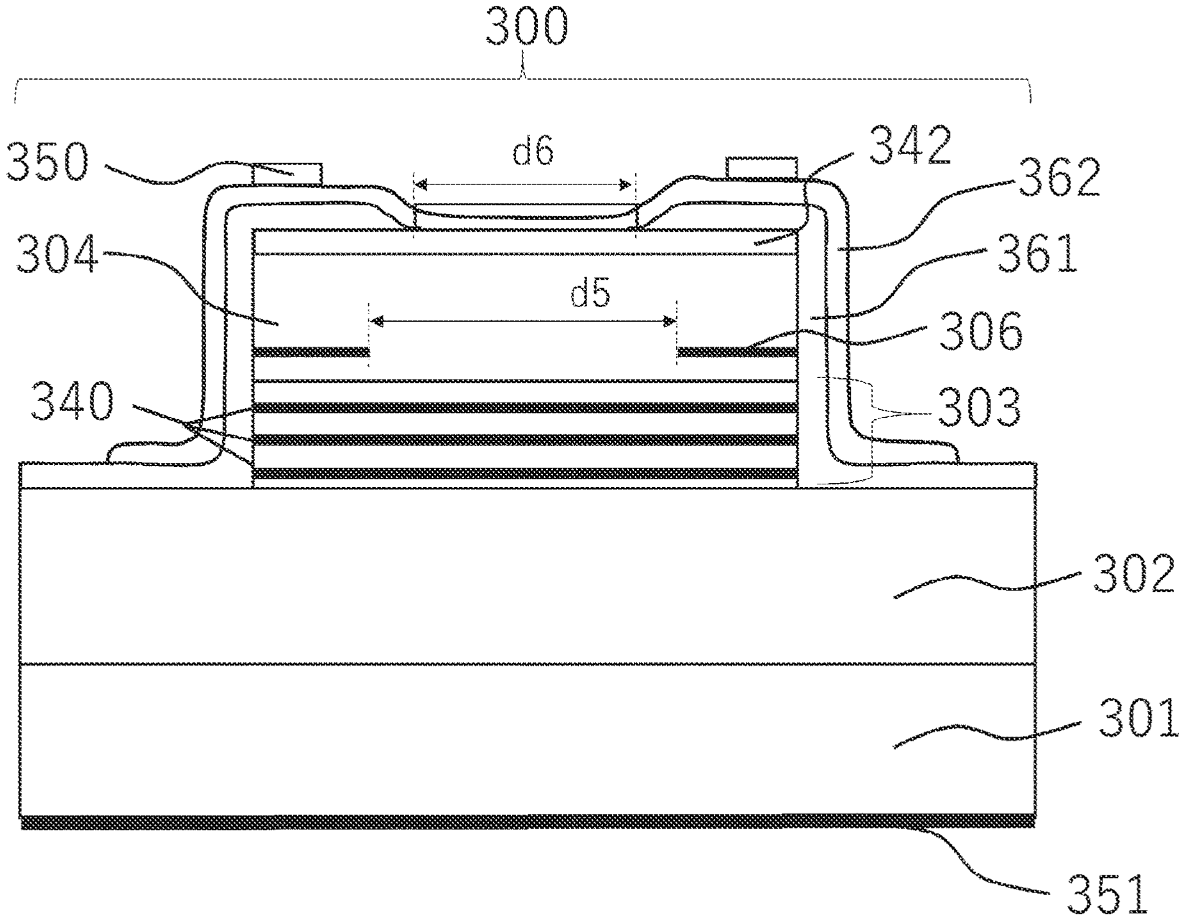
FIG. 3B is a cross-sectional view of a VCSEL 300 of Example 2.

FIG. 3B is a schematic cross-sectional view of the VCSEL 300. The VCSEL 300 is configured with a lower DBR 302, a semiconductor resonator cavity 303, an upper DBR 304 and a tunnel junction layer 342, which are stacked in this sequence on a GaAs substrate 301.

Three quantum well layers 340 are disposed in the resonator cavity 303. An $Al_{0.98}GaAs$ is oxidized in a part of the upper DBR by steam oxidation, whereby an oxidation constriction layer 306, which has insulation properties, is formed.

The resonator cavity 303, the upper DBR 304 and the tunnel junction layer 342 are processed to be tubular mesa-shaped, and are covered with an insulation film 361. Furthermore, an indium tin oxide (ITO) layer is formed on the insulation film 361.

As illustrated in FIG. 3B, the insulation film 361, of which center portion is partially removed, is formed on the upper face of the upper DBR 304 which has been processed to be mesa-shaped, and in this insulation opening, the ITO layer 362 is in contact with the upper face of the upper DBR 304. The insulation opening of the insulation film 361 is a circle in Example 2. The ring electrode 350 is electrically in contact with a part of the ITO layer 362. A common electrode 351 is in ohmic contact with the rear face of the GaAs substrate 301.

When an $Al_{0.1}GaAs$ layer and an $Al_{0.9}GaAs$ layer, of which optical film thicknesses are both λc/4, form a pair, the lower DBR 302 is configured with 35 pairs that are stacked. λc is a central wavelength of the high reflection band of the lower DBR 302, and is 940 nm in Example 2.

The quantum well layer 340 has a configuration where an 8 nm $In_{0.1}GaAs$ layer is sandwiched by 10 nm $Al_{0.1}GaAs$ burrier layers. In Example 2, three quantum well layers are disposed in the resonator cavity 303.

When an $Al_{0.1}GaAs$ layer and an $Al_{0.9}GaAs$ layer, of which optical film thickness are both λc/4, form a pair, the upper DBR 304 is configured with 20 pairs that are stacked. A part of the $Al_{0.1}GaAs$ layer closest to the quantum well layer 340 of the upper DBR, however, is replaced with an $Al_{0.98}GaAs$ layer of which thickness is 30 nm. After the mesa of the VCSEL 300 is formed, the $Al_{0.98}GaAs$ layer is oxidized from the side wall of the mesa for a predetermined length from the edge of the mesa by steam oxidation, whereby the oxidation constriction layer 306 having insulation properties is formed.

The tunnel junction layer 342 is configured with a p-type GaAs layer (p-type semiconductor layer) which has been doped to a carrier density of $5\times10^{19}$ $cm^{-3}$ or more, and an n-type GaAs layer (n-type semiconductor layer) which has been doped to a carrier density of $1\times10^{19}$ $cm^{-3}$ or more. Since the p-type layer and the n-type layer of which carrier densities both exceed $1\times10^{18}$ $cm^{-3}$, are directly in contact like this in the tunnel junction layer, current also flows in the opposite direction via a thin depletion layer, which is generated on the p-n junction interface by the tunnel effect.

The number of pairs is designed so that the reflectance of the lower DBR 302 becomes higher than the reflectance of the upper DBR 304. Further, the insulation film 361 and the ITO layer 362 disposed on the upper DBR 304 are transparent and transmit light at the light-emitting wavelength, hence the VCSEL 300 of Example 2 can extract light from the side of the upper DBR 306.

The VCSEL 300 has the same configuration as Example 1 in terms of the existence of an opening on a part of the insulation film in the upper portion of the mesa, but a tunnel junction layer 342 exists in the case of Example 2. The contact region in the VCSEL 300 is configured with the insulation film 361 which has an insulation opening formed on the n-type GaAs layer of the tunnel junction layer, and the ITO layer (transparent conductive film) 362 which is in contact with the upper DBR 304 at the insulation opening portion in which the insulation film 361 has been removed. In Example 2, preferable diameter d6 of the insulation opening and diameter d5 of the non-oxidized portion are different from those of Example 1, because the tunnel junction layer 342 exists. The effect thereof will be described below.

The diameter d6 of the insulation opening portion where the insulation film 361 has been removed is 20 μm, and the diameter d5 of the non-oxidized portion on the inner side of the oxidation constriction layer 506 is 70 μm. The effect thereof will be described based on the calculation result in FIG. 3D. FIG. 3D indicates a current density distribution calculated when d5 is fixed to 70 μm and d6 is changed. As indicated in FIG. 3D, the current density distribution maintains the profile of which center portion protrudes if d6 is up to 20 μm. In this case, current can be injected into the boundary of the oxidized portion and the non-oxidized portion, that is, the position of 35 μm in FIG. 3D. If d6 is 30 μm or more, the point at which the current density is maximum is no longer the center of the non-oxidized portion, that is, it is no longer the position 0 in FIG. 3D. In other words, the current density distribution is no longer in the state of the profile of which the center portion protrudes. Therefore in Example 2, the tunnel junction layer 342 is disposed on the uppermost portion of the mesa, and therefore, compared with Example 1, the current density distribution of which center portion protrudes can be implemented in a wider area.

Figure 3C:
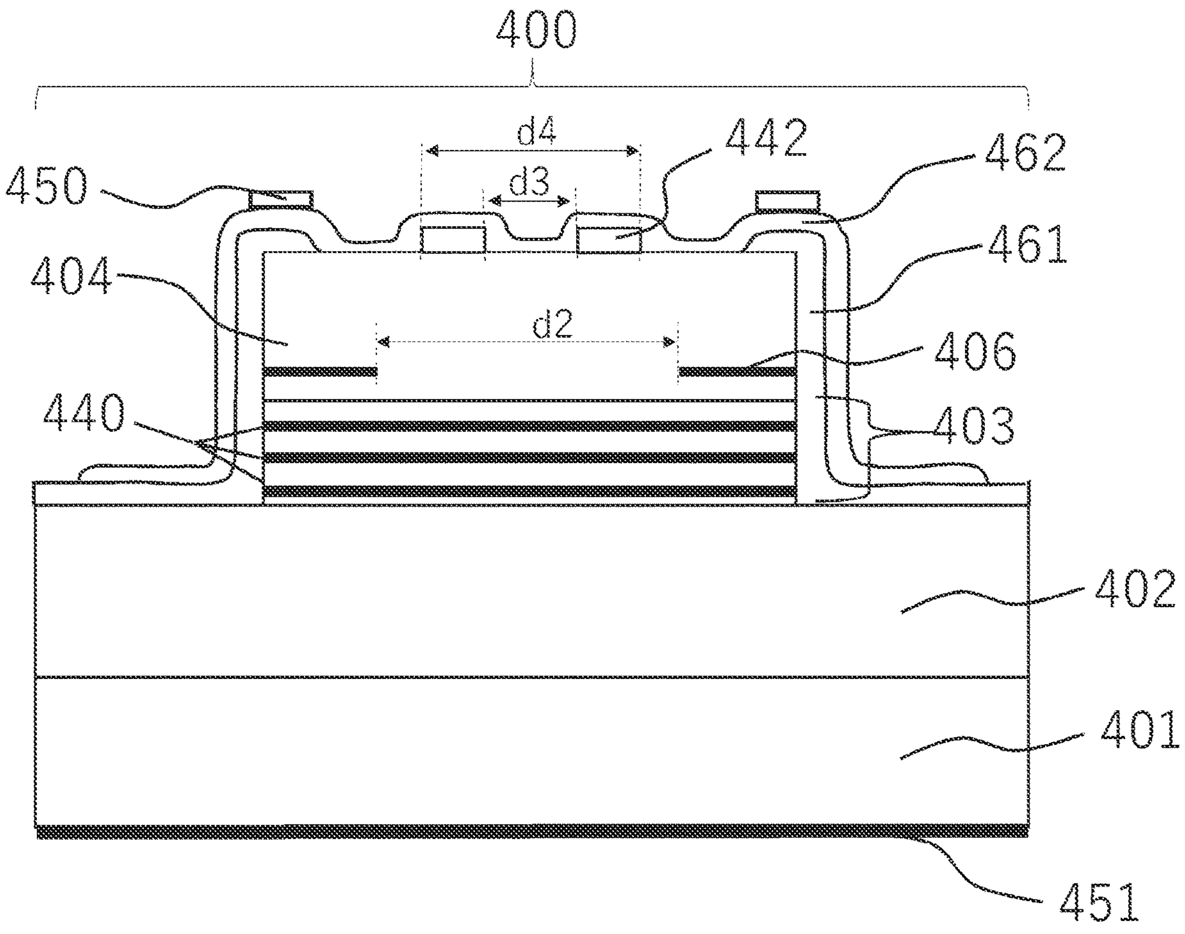
FIG. 3C is a cross-sectional view of a VCSEL 400 of Example 2.
Figure 3D:
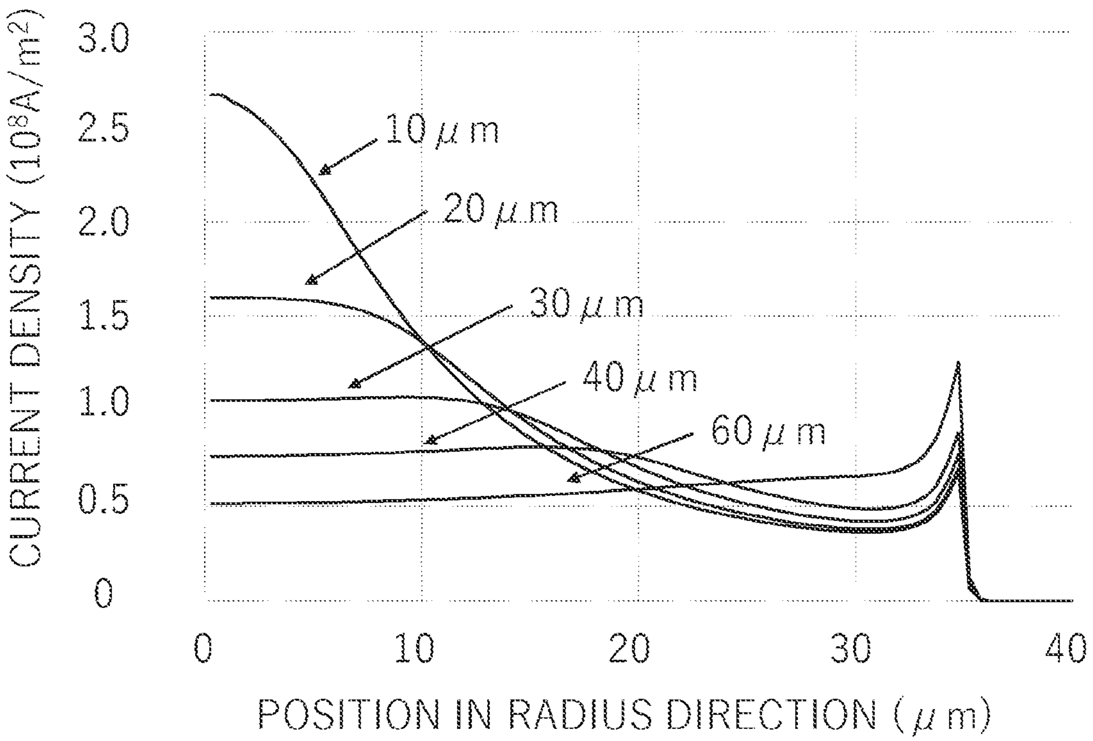
FIG. 3D is a graph for describing a current density distribution in Example 2.

FIG. 3C is a schematic cross-sectional view of the VCSEL 400. The layer configuration from a rear face electrode 451 to a tunnel junction layer 442 is the same as that of the VCSEL 300. As indicated in FIG. 3C, the tunnel junction layer 442 is processed to be annular-shaped. In other words, a region in which the tunnel junction layer is disposed and a region in which the tunnel junction layer is not disposed exist on the surface of the upper DBR 404 of the VCSEL 400. An inner diameter d3 of the annular-shaped tunnel junction layer 442 is 35 μm, and the outer diameter d4 thereof is 45 μm. On the upper face of the tunnel junction layer 442 and the upper face of the upper DBR 404, the ITO layer 462 is formed in a portion (or at least a part thereof) where the tunnel junction layer 442 is not disposed. On the ITO layer 462, a ring electrode 450 is disposed. Furthermore, an insulation film 461 is formed on the side wall of the mesa.

In Example 2, the tunnel junction layer 342 of the VCSEL 300 is disposed on the entire surface of the upper DBR 304, where even a portion, other than the portion in contact with the ITO layer 362, is not removed. In the VCSEL 400, on the other hand, the tunnel junction layer 442 is processed to be annular-shaped. Therefore in the VCSEL 400, the tunnel junction layer 442 has no function to spread the current in the horizontal direction, and the shape of the portion where the tunnel junction layer 442 has not been removed determines the distribution of the current injected into the DBR 404. The current distribution of the current injected into the active layer 440 is determined by the diffusion of the current in the upper DBR 404. In other words, this aspect is the same as the VCSEL 200 in Example 1. Hence the size of the annular shape of the tunnel junction layer 442 is the same as Example 1, and the current density distribution of the current injected into the active layer 440 is also the same as Example 1.

Whether the tunnel junction layer is removed or not is determined depending on the degree of diffusion of current in the horizontal direction, which is required to form a desirable current distribution at the 70 μm diameter of the same non-oxidized portion. In the VCSEL 300, conductivity of the n-type layer constituting the tunnel junction layer 342 is high, hence by using this effect, the current is diffused in the horizontal direction. In the VCSEL 400, on the other hand, a better current injection distribution can be acquired when the conductivity of the n-type layer constituting the tunnel junction layer 462 is not used. Therefore unnecessary portions of the tunnel junction layer 442 are removed, so that the tunnel junction layer 442 becomes annular-shaped.

This effect of diffusion of the current can also be acquired by disposing the tunnel junction layer 342 of the VCSEL 300 on a partial region, including the insulation opening portion of the upper DBR 304, instead of disposing the tunnel junction layer 342 on the entire upper face of the upper DBR 304. For example, the tunnel junction layer 342 may be formed so that the center of the mesa is included and the diameter is larger than d5, so as to enclose the entire non-oxidized portion of the oxidation constriction layer 306 in the planar view.

Figure 3E:
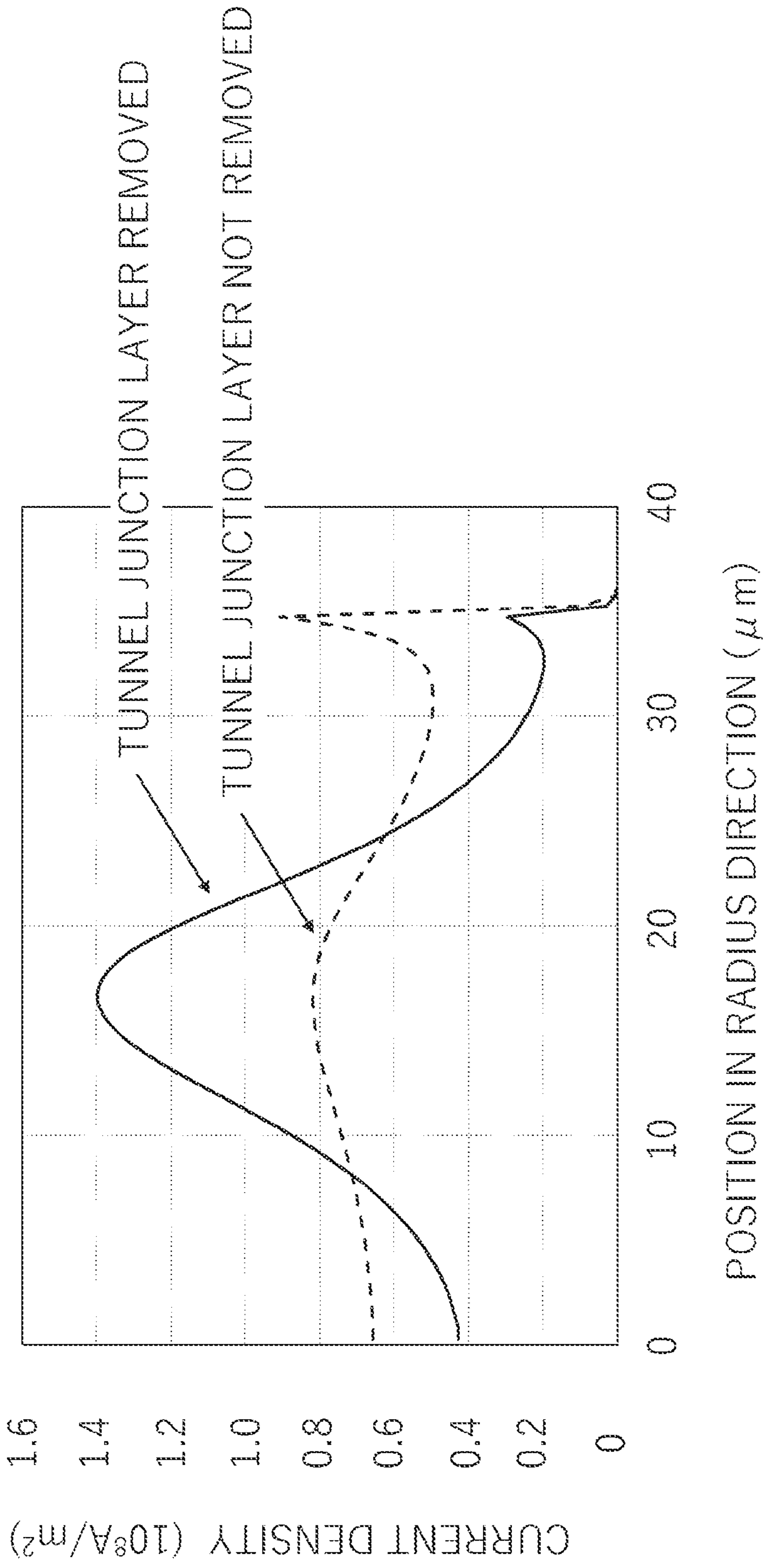
FIG. 3E is a graph for describing a current density distribution in Example 2.

FIG. 3E is a graph of the result of calculating the current injection distribution of current injected into the active layer in the configuration where the tunnel junction layer 442 is removed except for the annular-shaped portion (inner diameter of 30 μm and outer diameter of 40 μm), and in the configuration where the tunnel junction layer 442 is not removed. Here the current is injected from the annular-shaped region (inner diameter of 30 μm and outer diameter of 40 μm). This being the case, when the tunnel junction layer 442 is not removed, the ratio of the maximum value at the position in the vicinity of 17 μm in the horizontal direction and the minimum value at the position at the position in the vicinity of 31 μm in the horizontal direction is 1.65, whereas in the case where the tunnel junction layer 442 is removed except for the annular-shaped portion, the ratio of the maximum value and the minimum value becomes about 7.04 times the former case. This indicates that the current distribution that is closer to the oscillation mode, having the bi-modal intensity distribution in the horizontal direction, is acquired when the tunnel junction layer is removed except for the annular-shaped portion, and the configuration in FIG. 3C is more desirable.

Figure 3F:
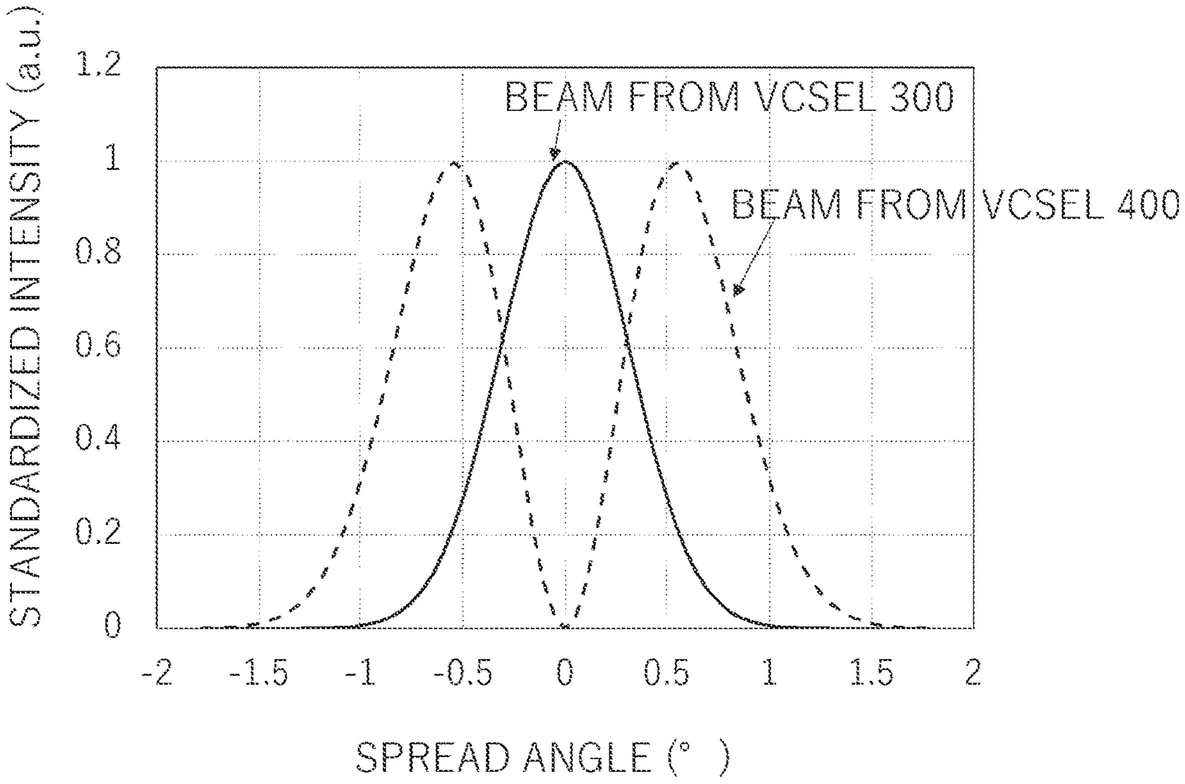
FIG. 3F is a graph for describing a beam intensity distribution in a far field region in Example 2.
Figure 3G:
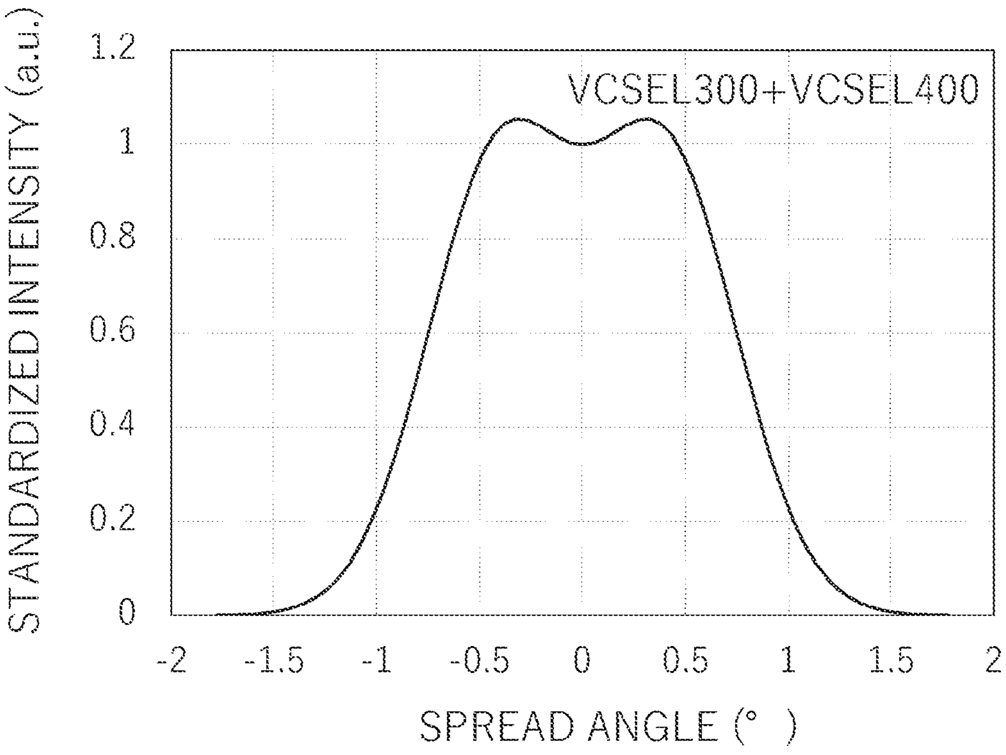
FIG. 3G is a graph for describing a beam intensity distribution in a far field region in Example 2.

FIG. 3F indicates an intensity of the lights beams from the VCSEL 300 and the VCSEL 400 in the far field region. This is the result of roughly estimating the intensity distribution in the 0-order and first-order transverse modes based on the half value width of the current density distributions indicated in FIGS. 3D and 3E, and determining the far field patterns therefrom. FIG. 3G indicates an intensity distribution when the above intensity distributions are superimposed at the intensity ratio based on the number of VCSELs indicated in FIG. 3A. The intensity ratio between the VCSEL 300 and the VCSEL 400 is designed to be about 1:3, and the major components are those of the VCSEL 400. Therefore in the VCSEL array 20 of Example 2, more VCSELs 400 are disposed than VCSELs 300.

As this graph in FIG. 3G indicates, by comparing the beams from the VCSEL 300 and the VCSEL 400 and superimposing the beams at the designed intensity ratio, the intensity becomes uniform within the range of the spread angle of −0.5 to +0.5° at the center. Further, compared with the lower part of the beam profile after the superimposition of Example 1 indicated in FIG. 2D, the lower part extends to about ±2° in Example 1 (FIG. 2D), while it is shorter (to about ±1.5°) in Example 2 (FIG. 3G). The width uniformed portions are both in the ±0.5° range, hence the profile of Example 2 is closer to a rectangle.

In Examples 1 and 2, the range exceeding ±0.5° may be shielded by an optical diaphragm or the like, so that only the uniformed portion of the beam can be extracted and used, for example. In this case, as the widths of the lower part become less in ranges exceeding ±0.5° outside the uniformed region, less quantity of light is lost by the light shielding. In other words, in the case of using the optical diaphragm, Example 2 is preferable to Example 1, since less quantity of light is lost.

Example 3

Figure 4A:
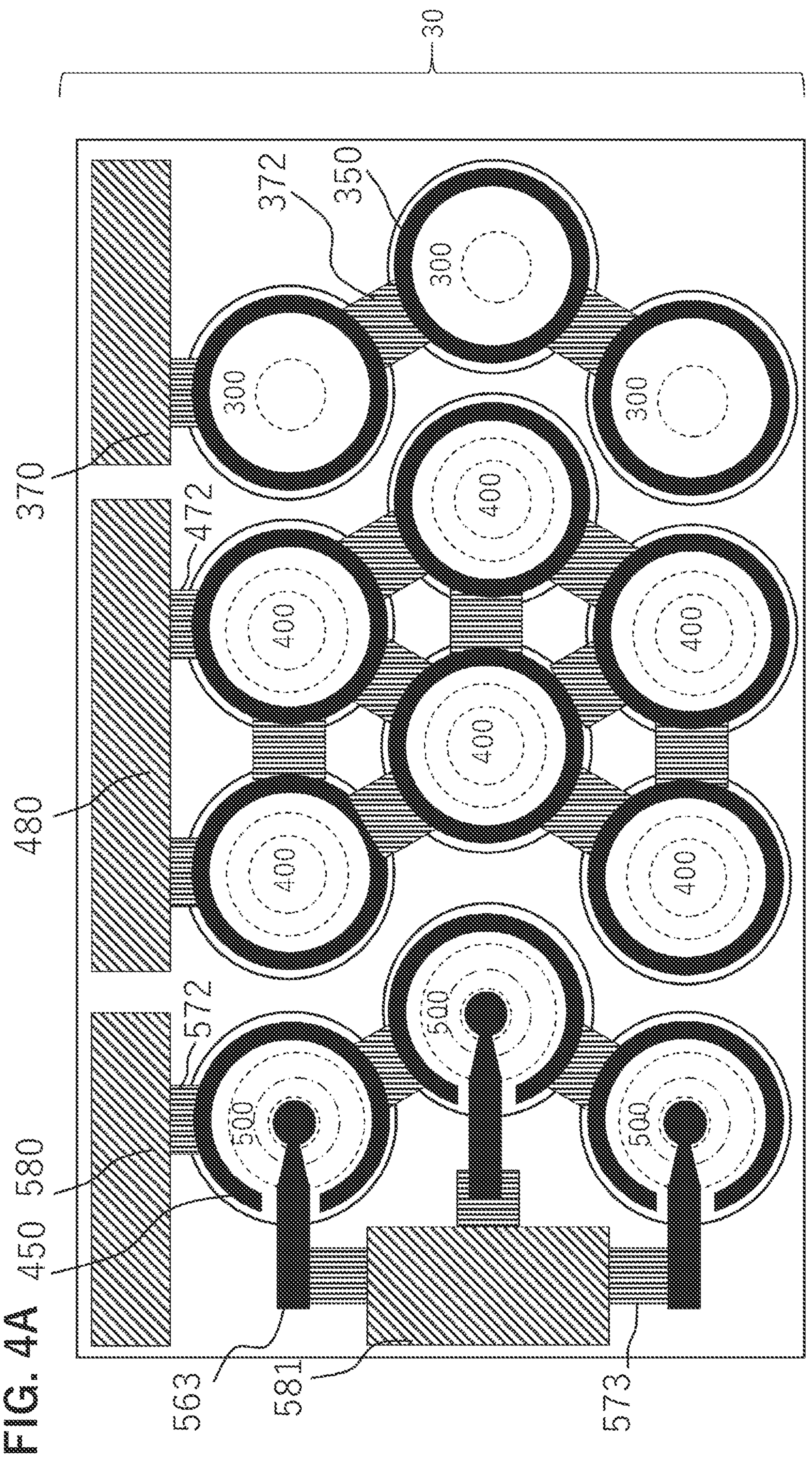
FIG. 4A is a top view of a VCSEL array 30 of Example 3.

FIG. 4A indicates a VCSEL array 30 according to Example 3. In Example 3, VCSELs 500 is disposed in addition to the VCSELs 300 and the VCSELs 400 used in Example 2. The VCSEL 300 and the VCSEL 400 were described in Example 2, hence a detailed description thereof will be omitted.

Figure 4B:
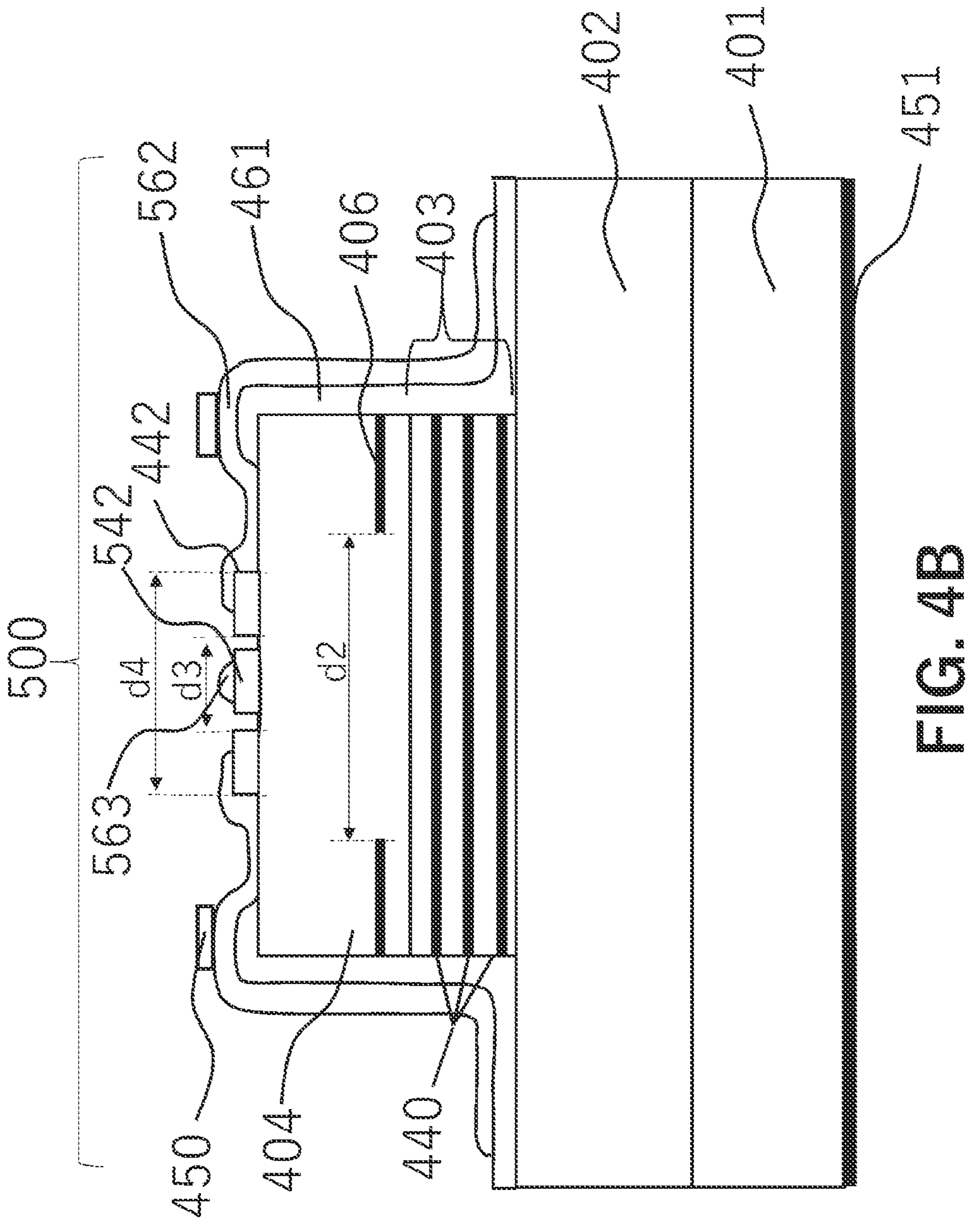
FIG. 4B is a cross-sectional view of a VCSEL 500 of Example 3.

FIG. 4B is a schematic cross-sectional view of the VCSEL 500. In the VCSEL 500, a same member as the VCSEL 400 is denoted with a same reference number, and description thereof will be omitted. A difference from the VCSEL 400 is that a tunnel junction layer 542 is disposed on the upper DBR, in addition to the annular-shaped tunnel junction layer 442, and are connected to an ITO layer 562 and an ITO layer 563, which are electrically independent from each other. In other words, on the upper DBR of the VCSEL 500, two contact regions, which are connected to different power supplies, are disposed. The tunnel junction layer 542 is circular, and is disposed inside the inner diameter of the annular-shaped tunnel junction layer 442.

Figure 4C:
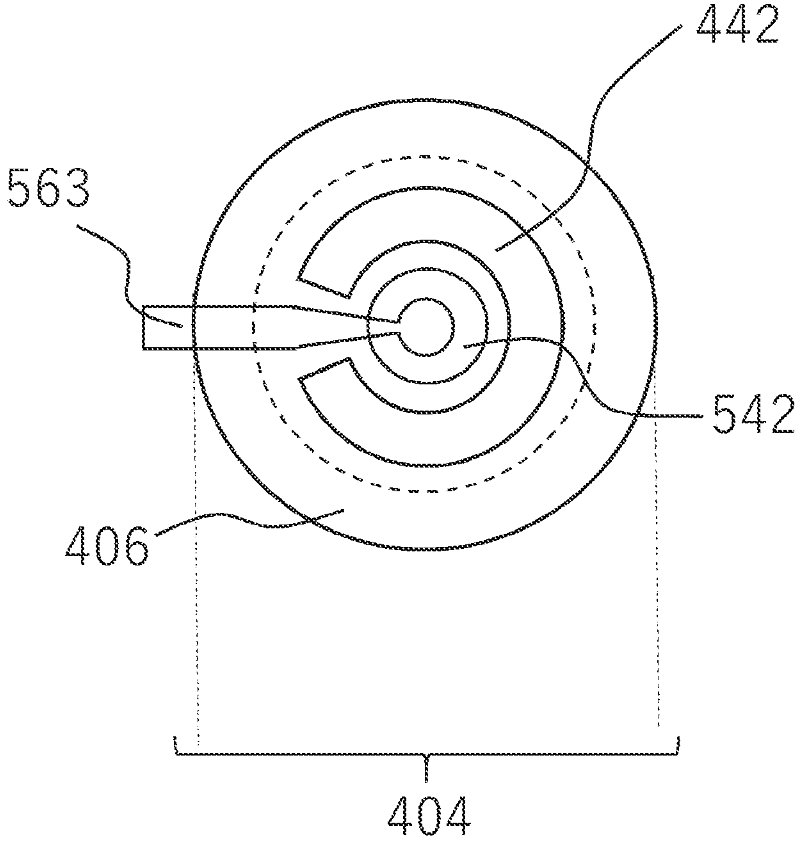
FIG. 4C is a top view of the VCSEL 500 of Example 3.

FIG. 4C is a top view of the VCSEL 500. This is a diagram for mainly describing the shape of the tunnel junction layer, and illustration of the ITO layer 562 and the upper electrode 450 are omitted for explanatory convenience.

As indicated in FIGS. 4B and 4C, the tunnel junction layer 442 and the tunnel junction layer 542 are electrically independent from each other. The tunnel junction layer 442 is annular-shaped, which is partially cutout, and current is injected from this cut position, whereby the bi-modal current density distribution can be generated, just like the VCSEL 400. The tunnel junction layer 542, on the other hand, is circular, just like the VCSEL 100, and generates a uni-modal current density distribution. This means that FFP can be controlled by controlling the ratio of the current values from these two tunnel junction layers. The center of the tunnel junction layer 542 (circular) matches with the center of the non-oxidized portion (portion where conductivity is high and current can flow) of the oxidation constriction layer 406. The contact region created by the tunnel junction layer 542 includes the center of the non-oxidized portion, and is completely included in the non-oxidized portion in the planar view. The center of the tunnel junction layer 442 (annular-shaped) also matches with the center of the non-oxidized portion, and is completely included in the non-oxidized portion in the planar view. Further, the tunnel junction layer 442 and the tunnel junction layer 542 are separated from each other, where the tunnel junction layer 542 is included in the inner side (inner diameter portion) of the annular-shaped tunnel junction layer 442, and the tunnel junction layer 442 surrounds the tunnel junction layer 542.

The disposition of each VCSEL in the VCSEL array 30 will be further described with reference to FIG. 4A.

Ring electrodes 350 on the VCSELs 300 are electrically connected to each other via each wiring electrode 372, and are also electrically connected to the pad 370 for wire bonding to supply current from the outside. Ring electrodes 450 on the VCSEL 400 are electrically connected to each other via each wiring electrode 472, and are also electrically connected to a pad 470 for wire bonding to supply current from the outside. The ring electrode 450 and an electrode 563 of the VCSEL 500 are connected via wiring electrodes 572 and 573 respectively, and are also connected to pads 580 and 581 respectively.

In Example 3, the configuration indicated in FIG. 4A is used in order to reduce electric cross-talk without making the wiring multilayer, but a different configuration may be used.

Advantageous effects of having the VCSEL 500 in Example 3 will be described. In the case of Example 3, when the balance of optical outputs from the VCSEL 300 and the VCSEL 400 is lost because of the driving conditions (including environmental temperature), aging, or the like, the profile of the FFP of the entire array can be corrected to a desirable shape by controlling the FFP of the VCSEL 500. To control the FFP of the VCSEL 500, the current injected into the two tunnel junction layers 442 and 542 of the VCSEL 500 is controlled as described above.

According to Example 3, the FFP can be corrected using the VCSEL 500, hence Example 3 contributes to improving the reliability of the ToF system. For example, in the case where either the VCSEL 300 or the VCSEL 400 fails and the light-emitting quality drop, this configuration makes the ToF system reliable.

As mentioned above, the FFP profile can be corrected in the case where either the VCSEL 300 or the VCSEL 400 fails and the optical output from the array drops, and uniformity of the FFP also worsens. Specifically, the FFP and the optical output can be recovered to a predetermined range of the ToF system by controlling the current to be injected via the ITO layers 562 and 563 connected to the VCSEL 500. Therefore for the optical output, a number of VCSELs has been designed such that the optical output necessary for the ToF system can be acquired from the array configuration, even if the VCSEL 500 is not driven at the maximum rating current value. Then when a failure occurs, the current to be injected into the VCSEL 500 is increased so as to recover both the uniformity of the FFP and the optical output, whereby the ToF system can maintain the same characteristics as before the failure.

For the uniformity of the FFP, an abnormality of the FFP on the light source side can be detected using the information on the density, which is commonly included in the images capturing a plurality of different imaging targets, based on the images capture don the imaging side in the ToF system. In the case where an abnormality is checked during inspection, or the like, instead of the state of actually using the ToF system, the image captured by emitting light to a plane of which reflectance is constant may be used for correction.

In Example 3, the VCSELs 300, the VCSELs 400 and the VCSELs 500 are disposed in a same array, and the FFP is corrected using the VCSELs 500, based on the beams from the VCSELs 300 and the VCSELs 400. As a modification, an array format constituted only of the VCSELs 500 also exhibits the effect of controlling the FFP well. In this configuration, compared with Example 3 in FIG. 4A, a number of wiring electrodes increases and the configuration of the array becomes complicated, and further, multilayer wiring is required depending on the arrangement of the VCSELs 500 in the array. However, an advantage of the configuration using only the VCSELs 500 is that distribution of the illumination light becomes symmetric even in a region closer than the far field region. Specifically, in the configuration of Example 3, different types of VCSELs are disposed in specific regions in the array, hence in a case where the light is emitted to an object in a region closer than the far field region, the intensity distribution of the illumination light becomes asymmetric, reflecting the above mentioned VCSEL arrangement in the array. This phenomenon becomes more obvious as the region approaches the near field region from the far field region. In the case of disposing only the VCSELs 500, on the other hand, the arrangement in the array is uniform, hence the symmetry is maintained (even through the intensity distribution of the illumination light changes) as the location approaches the near field region from the far field region.

For the far field region and the near field region mentioned above, the near field region includes not only the regions specified by the beams emitted from the VCSELs, but also the near field region specified by the beams after being converted by the optical system, such as a lens of the ToF system or the like. The length of the near field region after being converted by the optical system often becomes longer than the length of the near field region specified based on the beam characteristics immediately after being emitted from the VCSEL, and depending on the design of the optical system, symmetry in the near field region in some cases becomes important.

In Example 3, the ITO layer (transparent conductive film) 563 is used for the tunnel junction layer 542 of the VCSEL 500, but metal wiring may be used instead of the transparent conductive film.

Figure 4D:
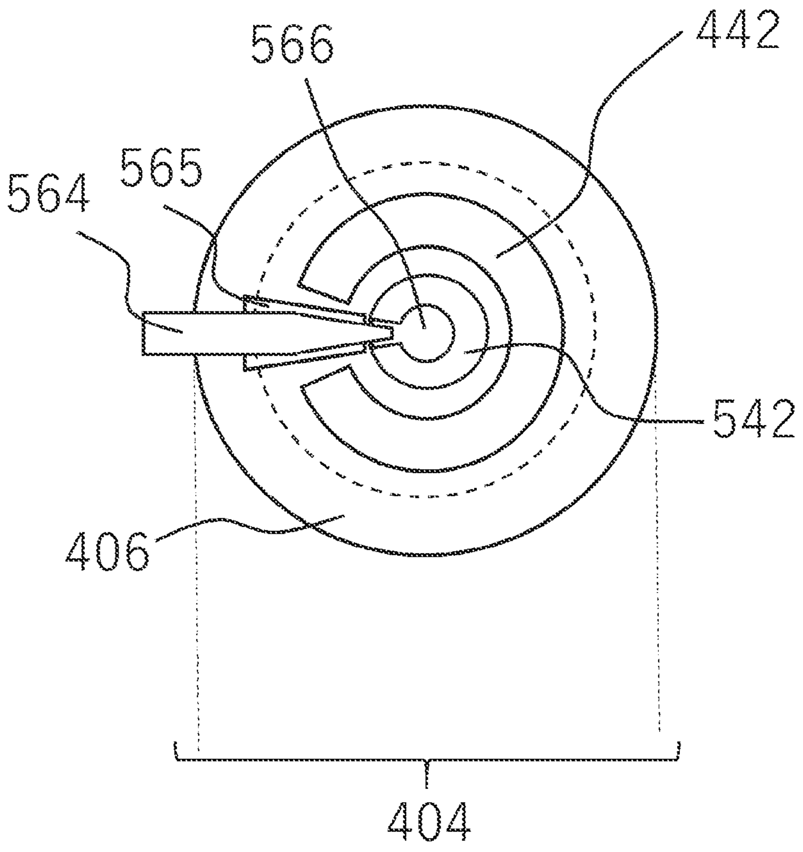
FIG. 4D is a top view of a VCSEL 500 (modification) of Example 3.

FIG. 4D is a top view of the VCSEL 500 according to this modification. As mentioned above, a metal wiring 564 is used for the connection to the tunnel junction layer 542. An ITO layer (transparent conductive film) 566 is disposed on the upper face of the tunnel junction layer 542, and the metal wiring 564 and the ITO layer 566 are electrically connected.

In this modification, the light extraction efficiency drops due to the light shielding by the metal wiring 564, hence an insulation film 565 is disposed under the metal wiring 564. The optical film thickness of the insulation film 565 is λc/4. Thereby the laser oscillation can be interrupted by lowering the reflectance under the metal wiring 564, and the drop in the light extraction efficiency, due to the light shielding by the metal wiring 564, can be restrained.

Example 4

Figure 5A:
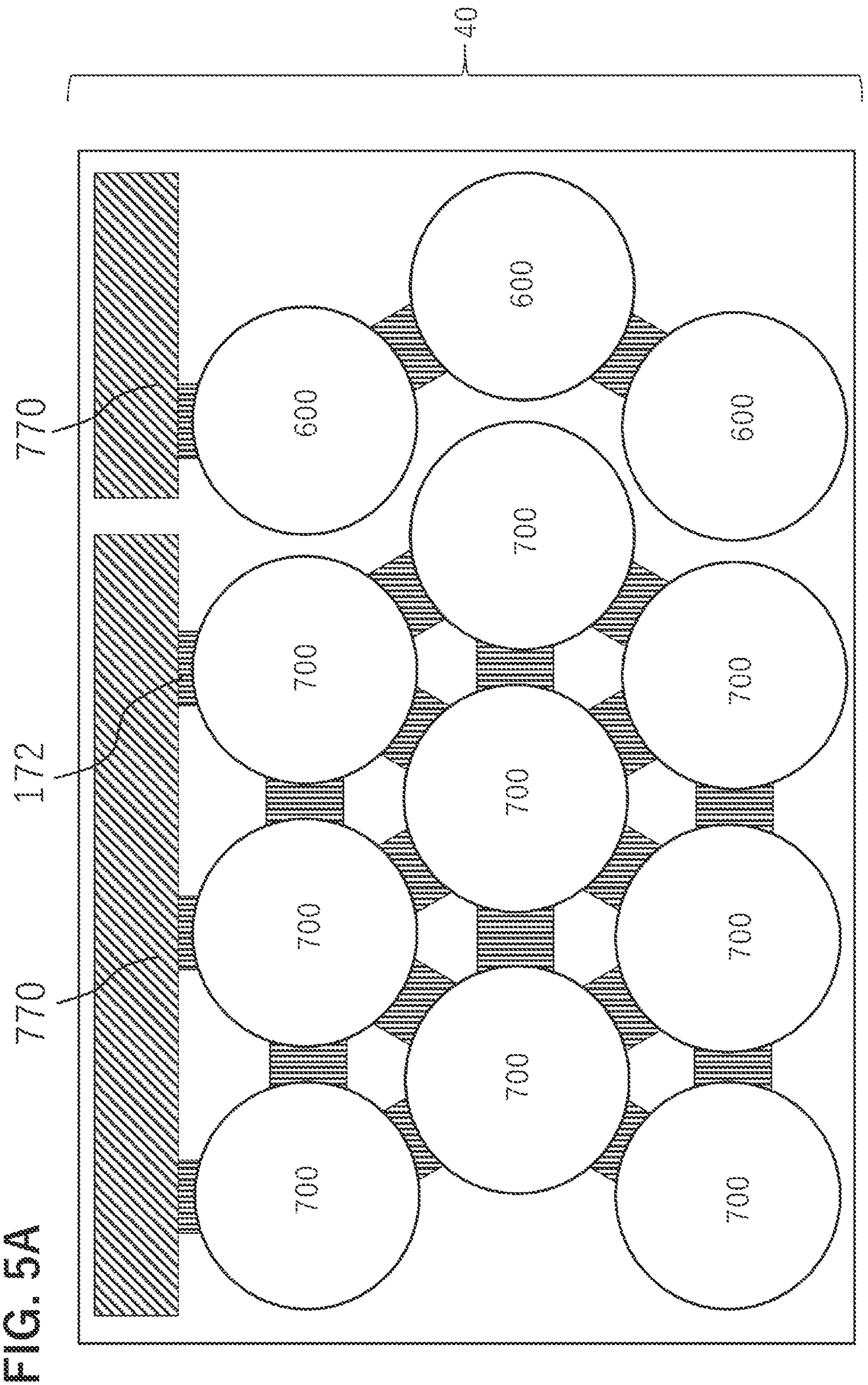
FIG. 5A is a top view of a VCSEL array 40 of Example 4.

FIG. 5A indicates a VCSEL array 40 using VCSELs 600 and VCSELs 700 according to Example 4. In FIG. 5A, the illustration of the wiring electrode and the contact region shape are omitted. In Example 4, the size of the VCSEL 600 which emits a laser beam to generate a uni-modal FFP and the size of the VCSEL 700 which emits a laser beam to generate a bi-modal FFP are similar, and the light-emitting diameter is about 70 μm in both VCSELs 600 and 700. The light-emitting diameters and the arrangement of the VCSELs in the VCSEL array are the same as Example 2, but a difference from Example 2 is that the VCSEL of Example 4 has a form of emitting the light from the rear face of the GaAs substrate, as described below with reference to FIG. 5B and FIG. 5C.

Figure 5B:
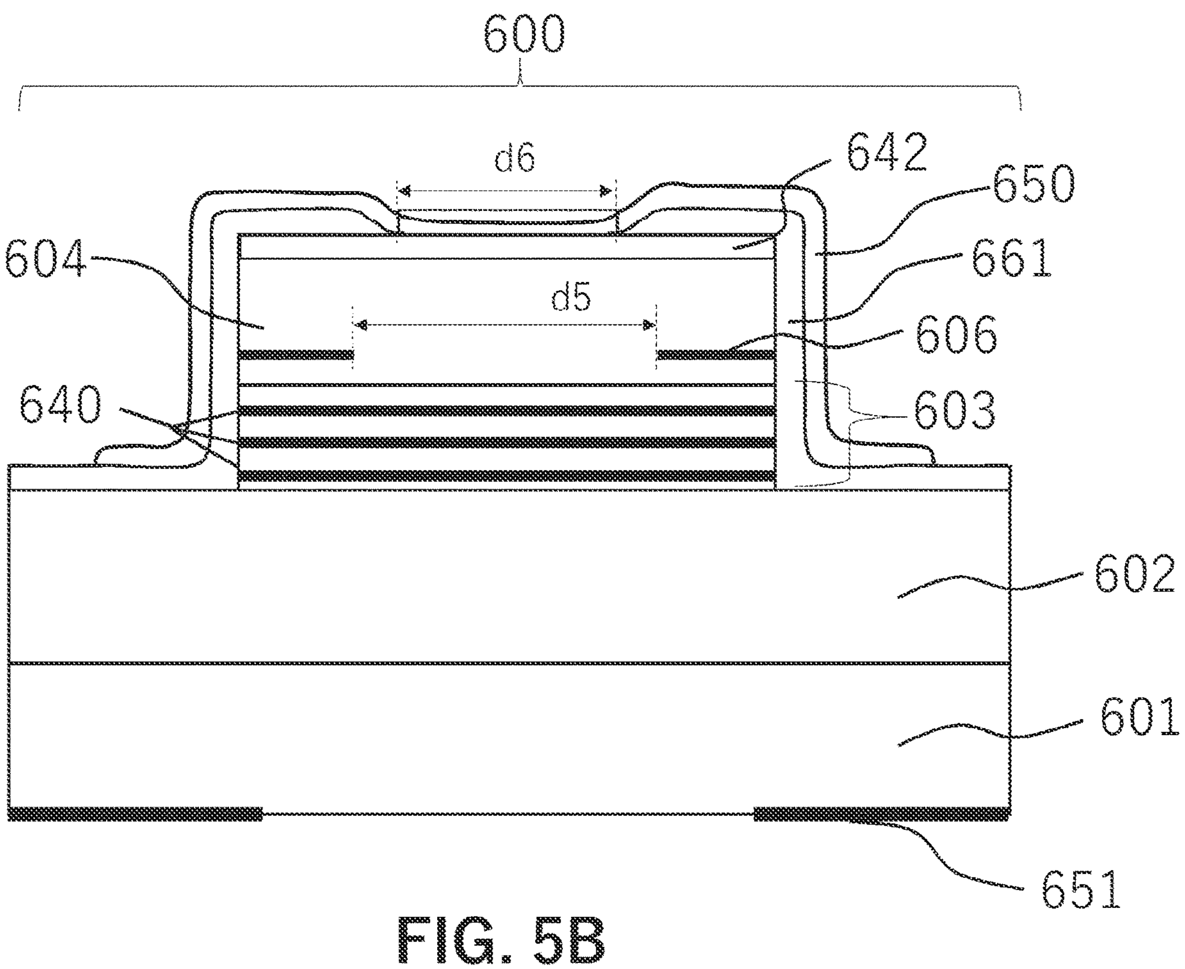
FIG. 5B is a cross-sectional view of a VCSEL 600 of Example 4.

FIG. 5B is a schematic cross-sectional view of the VCSEL 600. The VCSEL 600 consisted of a lower DBR 602, a semiconductor resonator cavity 603, an upper DBR 604, and a tunnel junction layer 642, which are stacked in this sequence on the GaAs substrate 601.

Three quantum well layers 640 are disposed in the resonator cavity 603. An $Al_{0.98}GaAs$ is oxidized in a part of the upper DBR by steam oxidation, whereby an oxidation constriction layer 606, which has insulation properties, is formed.

The resonator cavity 603, the upper DBR 604 and the tunnel junction layer 642 are processed to be tubular mesa-shaped, and are covered with an insulation film 661. As illustrated in FIG. 5B, on the insulation film 661, of which center portion is partially removed, an insulation opening is disposed. An upper electrode 650 is formed on the insulation film 661, and covers the semiconductor resonator cavity 603, the upper DBR 604, the insulation film 661, and the insulation opening thereof, which are processed to be mesa-shaped. The upper electrode 650 is formed of a metal material. The shape of the insulation opening is circular, and the upper electrode 650 is electrically in contact with the tunnel junction layer 642. A common electrode 651 is in ohmic contact with the rear face of the GaAs substrate 601, and the light-emitting portion has been removed in a circular shape.

When the $Al_{0.1}GaAs$ layer and the $Al_{0.9}GaAs$ layer, of which optical film thicknesses are both λc/4, form a pair, the lower DBR 602 is configured with 24 pairs that are stacked. λc is a central wavelength of the high reflection band of the lower DBR 602, and is 940 nm in Example 4. The quantum well layer 640 has a configuration where the 8 nm thick $In_{0.1}GaAs$ layer is sandwiched by 10 nm thick $Al_{0.1}GaAs$ barrier layers. In Example 4, three quantum well layers are disposed in the resonator cavity 603.

When an $Al_{0.1}GaAs$ layer and an $Al_{0.9}GaAs$ layer, of which optical film thicknesses are both λc/4, form a pair, the upper DBR 604 is configured with 40 pairs that are stacked. A part of the $Al_{0.1}GaAs$ layer on the top layer, however, is replaced with a GaAs contact layer of which thickness is 50 nm and carrier density is $1\times10^{19}$ $cm^{-3}$, so as to improve the electric contact properties with the upper electrode 650. Furthermore, a part of the $Al_{0.1}GaAs$ layer closest to the quantum well layer (active layer) 640 of the upper DBR is replaced with an $Al_{0.98}GaAs$ layer of which thickness is 30 nm. After the mesa of the VCSEL 600 is formed, the $Al_{0.98}GaAs$ layer is oxidized from the side wall of the mesa for a predetermined length from the edge of the mesa by steam oxidation, whereby the oxidation constriction layer 606 having insulation properties is formed. The tunnel junction layer 642 is configured with a p-type GaAs layer which has been doped to a carrier density of $5\times10^{19}$ $cm^{-3}$, and an n-type GaAs layer which has been doped to a carrier density of $1\times10^{19}$ $cm^{-3}$.

The number of pairs is designed so that the reflectance of the upper DBR 604 becomes higher than that of the lower DBR 602, and the VCSEL 600 of Example 4 can extract light from the rear face side of the substrate.

The effect of the tunnel junction layer 642 of Example 4 and a preferable relationship between the insulation opening diameter and the diameter of the non-oxidized portion is the same as the VCSEL 300 of Example 2, hence description thereof will be omitted.

Figure 5C:
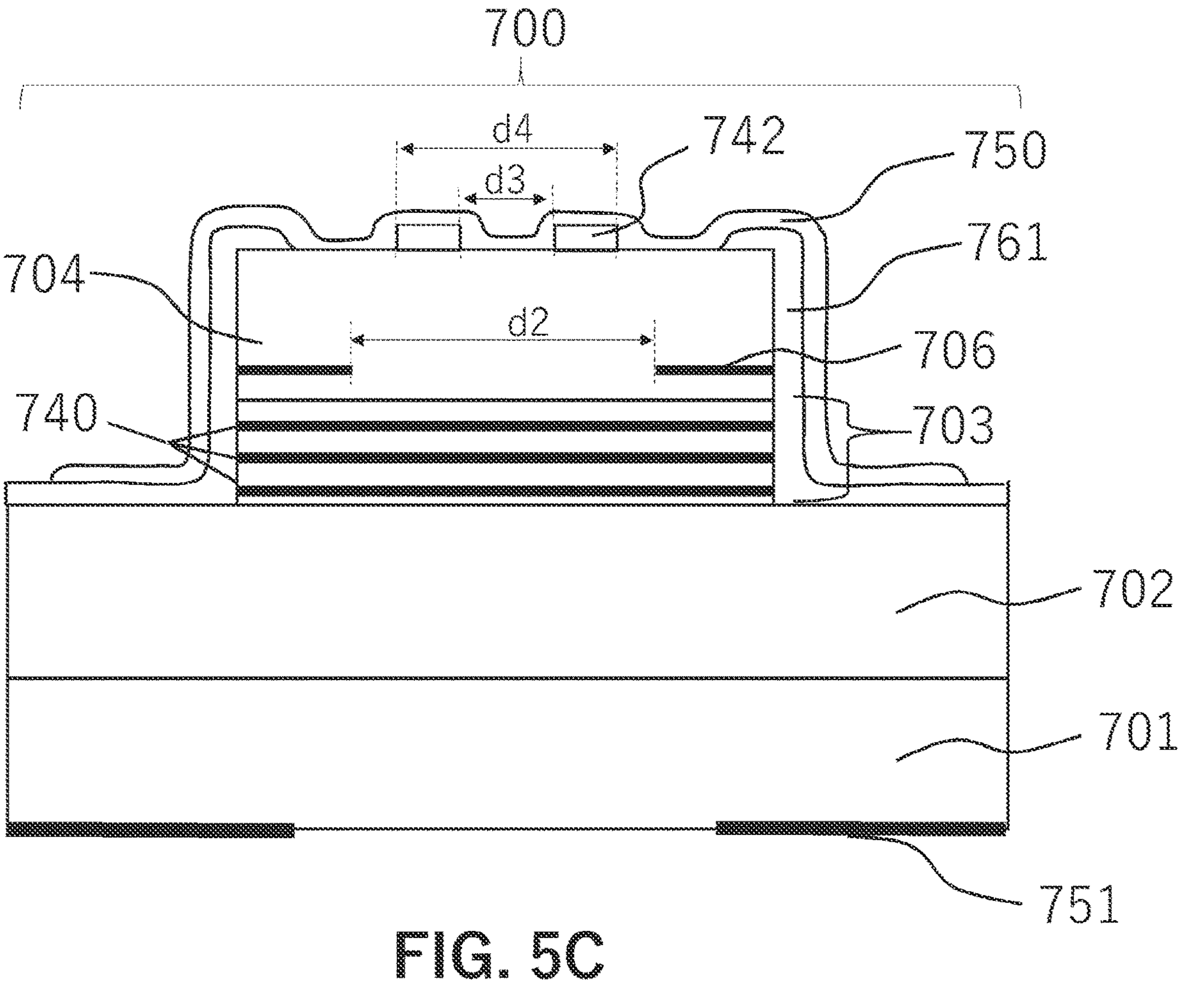
FIG. 5C is a cross-sectional view of a VCSEL 700 of Example 4.

FIG. 5C is a schematic cross-sectional view of the VCSEL 700. The layer configuration from a rear face electrode 751 to the tunnel junction layer 742 is the same as that of the VCSEL 600. As indicated in FIG. 5C, the tunnel junction layer 742 is processed in an annular shape on the outermost surface of the upper DBR 704. On the side wall of the mesa, an insulation film 761 is formed. An inner diameter d3 of the annular-shaped tunnel junction layer 742 is 35 μm, and an outer diameter d4 thereof is 45 μm. A surface electrode 750 covers an upper DBR 704, the insulation film 761 and the tunnel junction layer 742. The surface electrode 750 is also in direct contact with the DBR 704, but the current mainly flows on the path via the tunnel junction layer 742, which has been processed in an annular shape. This is because the surface electrode 750 is formed of an electrode material that can be in ohmic contact with the n-type GaAs layer, and is in Schottky contact with the DBR 704.

The number of pairs is designed so that the reflectance of the upper DBR 704 becomes higher than that of the lower DBR 702, and the VCSEL 700 of Example 4 can extract light from the rear face side of the substrate.

The effect of the spread of current via the tunnel junction layer 742 in the VCSEL 700 is the same as the VCSEL 400 of Example 2, hence description thereof will be omitted here.

Example 5

Figure 6:
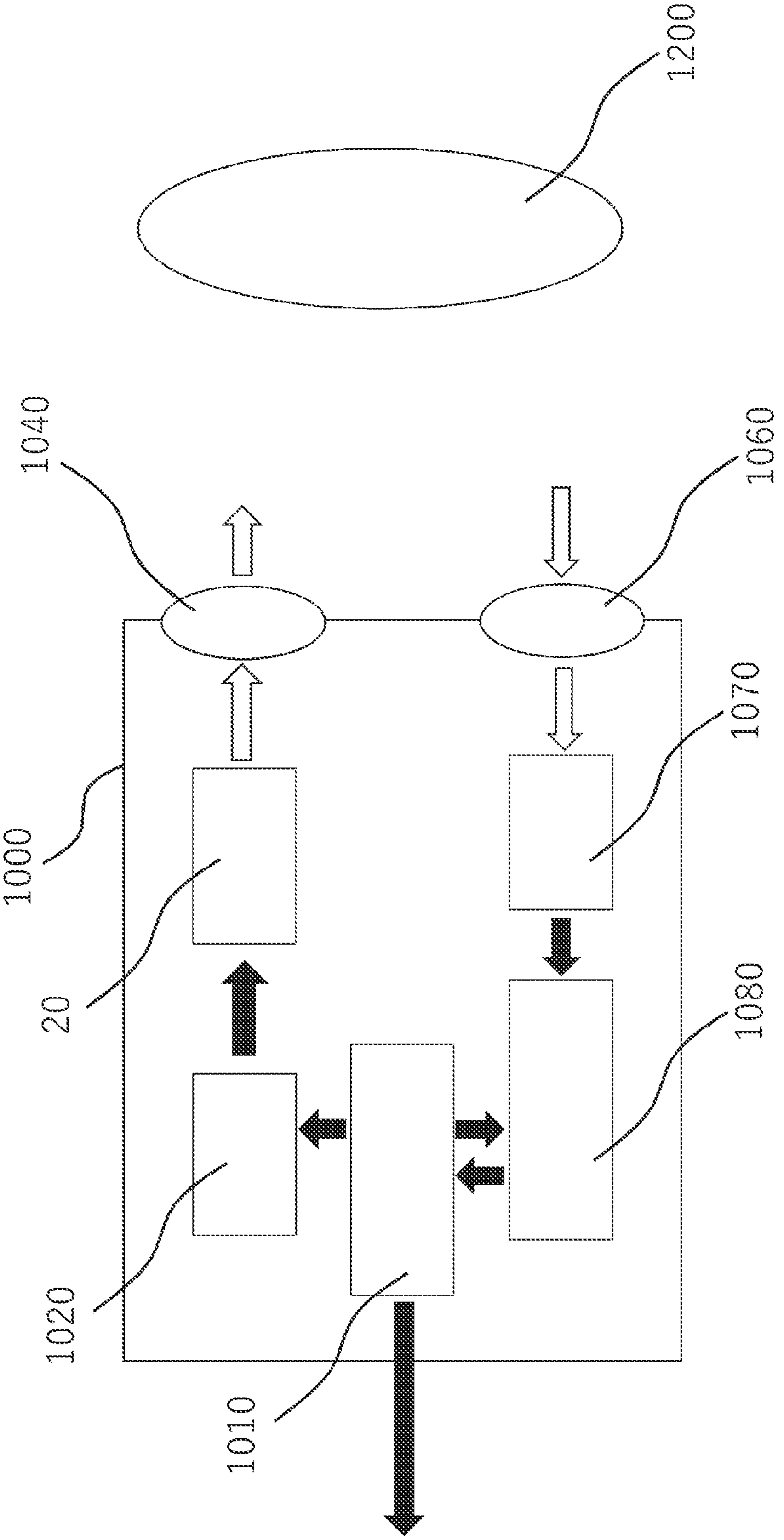
FIG. 6 is a schematic diagram depicting a ranging device of Example 6.

FIG. 6 indicates a laser light detection and ranging (LiDAR) device, in which the VCSEL array (surface emission laser array) 20 of Example 2 is used as a light source.

As indicated in FIG. 6, a ranging device 1000 is configured with a general control unit 1010, a VCSEL array driver 1020, a VCSEL array 20, a light-emitting side optical system 1040, a light-receiving side optical system 1060, a light-receiving image sensor 1070, and a distance data processing unit 1080.

In Example 5, the VCSEL array described in Example 2 is used, but the present invention is not limited thereto, and any VCSEL array described in the other examples may be used.

Each of the light-emitting side optical system 1040 and the light-receiving side optical system 1060 is illustrated as one convex lens-shaped member in FIG. 6, but this member is not configured with one convex lens system alone, but is configured with a lens group where a plurality of lenses are combined. The light-receiving image sensor 1070 is an image sensor in which a single photosensor, which can detect a light-receiving timing, is disposed in a two-dimensional array.

An outline of the operation of the ranging device 1000 follows. First a driving signal is outputted from the general control unit 1010 to the surface emission laser array driver 1020. After receiving the driving signal, the surface emission laser array driver 1020 injects a predetermined value of current to a surface emission laser array 1030 to oscillate the surface emission laser array 1030. The laser light generated in the surface emission laser array 1030 contacts a measurement target 1200 via the light-emitting side optical system 1040, and the light reflected by the measurement target 1200 enters the light-receiving image sensor 1070 via the light-receiving side optical system 1060. It does not matter whether the distance data processing unit 1080 and the light-receiving image sensor 1070 are disposed in a same package, or are mounted in different packages and electrically connected via a circuit board or the like, as long as the distance data processing unit 1080 is electrically connected to the light-receiving image sensor 1070.

An electric signal pulse outputted from each pixel of the light-receiving image sensor 1070 is inputted to the distance data processing unit 1080. The distance data processing unit 1080 calculates the distance information in the light-propagating direction based on the timing (detection timing) of the electric signal pulse outputted from each pixel of the light-receiving image sensor 1070 and the light-emitting timing of the surface emission laser array driver 1020, and generates and outputs three-dimensional information thereof.

In this way, the ranging device 1000 can output the three-dimensional information.

The ranging device 1000 can be applied to control for preventing collision with another vehicle, and control for driving automatically following another vehicle, or the like, in the automobile fields. Further, the ranging device 1000 can be used for a moving body (moving device) of a ship, an airplane, an industrial robot, or the like, and a moving body detection system. Furthermore, the ranging device 1000 can be applied to various equipment that three-dimensionally recognize an object, including distance information.

The application of the three-dimensional information is not limited to the above. For example, the distance information may be used for image processing. When a virtual object is superimposed and displayed on an acquired image of a real space, the virtual object can be displayed naturally on the image of the real world by using the three-dimensional information of the real space. Further, by acquiring the three-dimensional information simultaneously when an image is acquired, blurring can be corrected based on the three-dimensional information after the image is captured.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-000024, filed on Jan. 1, 2022, which is hereby incorporated by reference herein in its entirety.

What is claimed is:

1. A light source device in which a plurality of semiconductor light-emitting elements are disposed, each of the plurality of semiconductor light-emitting elements being configured with a first reflector, a resonator cavity including an active layer, and a second reflector which are stacked in this sequence on a semiconductor substrate,
   - wherein in each of the semiconductor light-emitting elements, an electric contact region for supplying carriers to the active layer is disposed on a surface of the second reflector on an opposite side thereof to the active layer,
   - wherein the plurality of semiconductor light-emitting elements include a first semiconductor light-emitting element of which shape of the contact region is a first shape, and a second semiconductor light-emitting element of which shape of the contact region is a second shape which is different from the first shape, wherein in at least one of the plurality of semiconductor light-emitting elements, wherein a tunnel junction layer is disposed on an n-type semiconductor layer and thereunder, on a surface of the second reflector on an opposite side thereof to the surface that is in contact with the active layer, and wherein the contact region is configured with an insulation film, a part of which has been removed, and which is disposed on the n-type semiconductor layer, and a conductive film that is in contact with the n-type semiconductor layer in a portion where the insulation film has been removed.

2. The light source device according to claim 1, wherein the first shape is circular, and wherein the second shape is annular.

3. The light source device according to claim 1, wherein each of the semiconductor light-emitting elements includes a current constriction portion, which is configured with an annular low conductivity region and a high conductivity region disposed on the inner side of the low conductivity region, in at least any of the first reflector, the resonator cavity, and the second reflector, and wherein the contact region is included in the high conductivity region of the current constriction portion in planar view.

4. The light source device according to claim 3, wherein a center of the first shape and a center of the second shape match with a center of the high conductivity region of the current constriction portion in planar view.

5. The light source device according to claim 1, wherein in at least one of the plurality of semiconductor light-emitting elements, wherein the contact region is configured with an insulation film, a part of which has been removed, and which is disposed on the second reflector, and a conductive film which is in contact with the second reflector in a portion where the insulation film has been removed.

6. The light source device according to claim 1, wherein the tunnel junction layer is configured with a p-type layer and an n-type layer, which have carrier densities of $1\times10^{19}$ $cm^{-3}$ or more, and which are directly in contact with each other.

7. The light source device according to claim 1, wherein in at least one of the plurality of semiconductor light-emitting elements, wherein a region in which an n-type semiconductor layer and a tunnel junction layer are disposed and a region in which an n-type semiconductor layer and a tunnel junction layer are not disposed exist on the surface of the second reflector, and wherein a conductive film is disposed on the region in which the tunnel junction layer is disposed, and on at least a part of the region in which the tunnel junction layer is not disposed.

8. The light source device according to claim 1, wherein the plurality of semiconductor light-emitting elements include a third semiconductor light-emitting element which includes a first contact region and a second contact region, which are connected to different power supplies respectively, on the surface of the second reflector of the third semiconductor light-emitting element.

9. The light source device according to claim 8, wherein the first contact region is a region that includes a center of the second reflector of the third semiconductor light-emitting element, and wherein the second contact region is a region that is separated from the first contact region and encloses the second contact region.

10. The light source device according to claim 1, wherein in each of the plurality of semiconductor light-emitting elements, wherein a reflectance of the first reflector is higher than a reflectance of the second reflector, wherein a transparent conductive film is formed on a front face of the second reflector, and wherein light is emitted from the front face of the second reflector.

11. The light source device according to claim 1, wherein in each of the plurality of semiconductor light-emitting elements, wherein a reflectance of the first reflector is lower than a reflectance of the second reflector, and wherein light is emitted via the semiconductor substrate.

12. A ranging device comprising:

the light source device according to claim 1;

a sensor that detects reflected light of light generated by the light source device; and a processing unit that acquires distance information, based on a detection timing to detect the reflected light.

13. A light source device in which a plurality of semiconductor light-emitting elements are disposed, each of the plurality of semiconductor light-emitting elements being configured with a first reflector, a resonator cavity including an active layer, and a second reflector which are stacked in this sequence on a semiconductor substrate, wherein in each of the semiconductor light-emitting elements, an electric contact region for supplying carriers to the active layer is disposed on a surface of the second reflector on an opposite side thereof to the active layer, and wherein the plurality of semiconductor light-emitting elements include a first semiconductor light-emitting element of which shape of the contact region is a first shape, and a second semiconductor light-emitting element of which shape of the contact region is a second shape which is different from the first shape, wherein in at least one of the plurality of semiconductor light-emitting elements, wherein a region in which an n-type semiconductor layer and a tunnel junction layer are disposed and a region in which an n-type semiconductor layer and a tunnel junction layer are not disposed exist on the surface of the second reflector, and wherein a conductive film is disposed on the region in which the tunnel junction layer is disposed, and on at least a part of the region in which the tunnel junction layer is not disposed.

14. A ranging device comprising:

the light source device according to claim 13;

a sensor that detects reflected light of light generated by the light source device; and a processing unit that acquires distance information, based on a detection timing to detect the reflected light.

* * * * *